(12) United States Patent
Smyka et al.

(10) Patent No.: US 11,715,624 B2
(45) Date of Patent: Aug. 1, 2023

(54) ADAPTIVE PULSE SHAPING WITH POST MATCH SENSOR

(71) Applicant: MKS Instruments, Inc., Andover, MA (US)

(72) Inventors: Jonathan W. Smyka, Rochester, NY (US); Aaron T. Radomski, Conesus, NY (US); Peter Paul, Penfield, NY (US); Aaron M. Burry, Ontario, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 17/396,901

(22) Filed: Aug. 9, 2021

(65) Prior Publication Data

US 2023/0041177 A1 Feb. 9, 2023

(51) Int. Cl.
*H01J 37/32* (2006.01)

(52) U.S. Cl.
CPC .. *H01J 37/32183* (2013.01); *H01J 37/32146* (2013.01); *H01J 37/32155* (2013.01)

(58) Field of Classification Search
CPC .......... H01J 37/32183; H01J 37/32146; H01J 37/32155
See application file for complete search history.

(56) References Cited

U.S. PATENT DOCUMENTS

| | | |
|---|---|---|
| 7,602,127 B2 | 10/2009 | Coumou |
| 8,110,991 B2 | 2/2012 | Coumou |
| 8,395,322 B2 | 3/2013 | Coumou |
| 8,781,415 B1 * | 7/2014 | Coumou ........... H01J 37/32935 330/149 |
| 9,041,480 B2 | 5/2015 | Radomski et al. |
| 10,049,857 B2 | 8/2018 | Fisk, II et al. |
| 10,546,724 B2 | 1/2020 | Radomski et al. |
| 10,821,542 B2 | 11/2020 | Nelson et al. |

(Continued)

FOREIGN PATENT DOCUMENTS

| | | |
|---|---|---|
| KR | 10-2016-0027926 A | 3/2016 |
| WO | WO-2011049769 A2 | 4/2011 |

OTHER PUBLICATIONS

International Search Report and Written Opinion regarding Patent Application No. PCT/US2022/024220, dated Aug. 9, 2022.

*Primary Examiner* — Henry Luong

(74) *Attorney, Agent, or Firm* — Harness, Dickey & Pierce, P.L.C.

(57) ABSTRACT

A RF generator includes a RF power source and a RF control module coupled to the RF power source. The RF control module is configured to generate at least one control signal to vary a respective at least one of an RF output signal from the RF power source or an impedance between the RF power source and a load. The RF output signal includes a RF signal modulated by a pulse signal, and the RF control module is further configured to adjust the at least one control signal to vary at least one of an amplitude or a frequency of the RF output signal or the impedance between the RF power source and the load to control a shape of the pulse signal. The at least one of the amplitude, the frequency, or the impedance is adjusted in accordance with respective feedforward adjustments that vary in accordance with a respective sensed pulse parameter detected between a matching network and the load.

29 Claims, 17 Drawing Sheets

(56) References Cited

U.S. PATENT DOCUMENTS

| | | |
|---|---|---|
| 2007/0135939 A1 | 6/2007 | Johnson et al. |
| 2013/0222055 A1 | 8/2013 | Coumou et al. |
| 2014/0306754 A1* | 10/2014 | Coumou .................. H03F 3/211 |
| | | 330/103 |
| 2017/0125218 A1* | 5/2017 | Sato .................. H01J 37/32183 |
| 2021/0050185 A1 | 2/2021 | Martinez et al. |

* cited by examiner

ADAPTIVE PULSE SHAPING WITH POST MATCH SENSOR

FIELD

The present disclosure relates to RF generator systems and control of RF generators.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma fabrication is frequently used in semiconductor fabrication. In plasma fabrication, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a RF generator having a RF power source. The generator also includes a RF control module coupled to the RF power source and configured to generate at least one control signal to vary a respective at least one of an RF output signal from the RF power source or an impedance between the RF power source and a load, where the RF output signal includes a RF signal modulated by a pulse signal, and the RF control module is further configured to adjust the at least one control signal to vary at least one of an amplitude or a frequency of the RF output signal or the impedance between the RF power source and the load to control a shape of the pulse signal. The generator also includes where at least one of the amplitude, the frequency, or the impedance is adjusted in accordance with respective feedforward adjustments that vary in accordance with a respective sensed pulse parameter detected between a matching network and the load. Other embodiments of this aspect include corresponding computer systems, apparatus, and computer programs recorded on one or more computer storage devices, each configured to perform the actions of the methods.

Implementations may include one or more of the following features. The RF generator where the respective feedforward adjustments vary at least one of the amplitude, frequency, or impedance in accordance with one of forward power, reverse power, delivered power, or a reflection coefficient. The amplitude of the RF signal varies in accordance with at least one of an amplitude of the at least one control signal or an amplitude of a rail voltage applied to the RF power source. The respective feedforward adjustments vary at least one of the amplitude of the at least one control signal or the amplitude of the rail voltage applied to the RF power source. The respective feedforward adjustments adjust at least one of a setpoint or an actuator. The RF control module is further configured to further adjust at least one of the amplitude, the frequency, or the impedance in accordance with a RF parameter sensed between the RF power source and the matching network, where the at least one of the amplitude, the frequency, or the impedance are further adjusted in accordance with a respective feedback signal that varies in accordance with the RF parameter. The RF control module further may include a setpoint modifier configured to receive a requested pulse shape including a pulse setpoint parameter and to receive the respective sensed pulse parameter and adjusting the pulse setpoint parameter in accordance with the respective sensed pulse parameter to output an adjusted pulse shape. The RF control module further may include a pulse synthesizer configured to receive the adjusted pulse shape and output a pulse setpoint profile in accordance with the adjusted pulse shape, the pulse setpoint profile including a RF parameter setpoint for controlling the RF power source. The at least one control signal varies in accordance with the RF parameter setpoint for controlling the RF power source. The amplitude of the RF signal varies in accordance with at least one of an amplitude of the at least one control signal or an amplitude of a rail voltage applied to the RF power source. The respective feedforward adjustments vary at least one of the amplitude of the at least one control signal or the amplitude of the rail voltage applied to the RF power source. The RF control module is further configured to further adjust at least one of the amplitude, the frequency, or the impedance in accordance with a RF parameter sensed between the RF power source and the matching network, where the amplitude, the frequency, or the impedance is adjusted in accordance with a respective feedback signal that varies in accordance with the RF parameter. The respective sensed pulse parameter is communicated between a post-match sensor and the RF control module using one of an analog or a digital communication link. The digital communication link includes at least one of a System Bus Datalink, an Ethernet Industrial Bus, a Transmission Control Protocol (TCP), a User Datalink Protocol (UDP), a fiber optic link, or a gigabit transceiver datalink. The respective feedforward adjustments are determined in accordance with parameters generated by one of a plant model or an inverse plant model that describes a variation of the pulse signal as it propagates from the RF generator to the load. The respective feedforward adjustments adjust at least one of a setpoint or an actuator. The respective feedforward adjustments adjust at least one of a setpoint or an actuator. Implementations of the described techniques may include hardware, a method or process, or computer software on a computer-accessible medium.

One general aspect includes a non-transitory computer-readable medium storing instructions. The non-transitory computer-readable medium storing instructions also includes generating a RF output signal to a load. The instructions also include generating at least one control signal to vary the RF output signal or an impedance between a RF power source and a load, where the RF output signal includes a RF signal modulated by a pulse signal. The instructions also include adjusting the at least one control signal to vary at least one of an amplitude or a frequency of the RF output signal or the impedance between the RF power source and the load to control a shape of the pulse signal. The instructions also include adjusting at least one of the amplitude, the frequency, or the impedance in accordance with respective feedforward adjustments that vary in accordance with a respective pulse parameter sensed between a matching network and a load. Other embodiments of this aspect include corresponding computer systems, apparatus, and computer programs recorded on one or more computer storage devices, each configured to perform the actions of the methods.

Implementations may include one or more of the following features. The non-transitory computer-readable medium where the respective feedforward adjustments vary at least one of the amplitude, the frequency, or the impedance in accordance with one of forward power, reverse, power, delivered power, reflected power, or a reflection coefficient. The amplitude of the RF signal varies in accordance with at least one of an amplitude of the at least one control signal or an amplitude of a rail voltage applied to a RF power source. The respective feedforward adjustments vary at least one of the amplitude of the at least one control signal or the amplitude of the rail voltage applied to the RF power source. At least one of the amplitude, the frequency, or the impedance of the RF signal are further adjusted in accordance with a respective feedback signal that varies in accordance with a RF parameter sensed between the matching network and the load. The non-transitory computer-readable medium wherein the instructions may include receiving a requested pulse shape including at least one pulse setpoint parameter and receiving the respective pulse parameter and adjusting the at least one pulse setpoint parameter in accordance with the respective pulse parameter to output an adjusted pulse shape. The non-transitory computer-readable medium wherein the instructions may include receiving the adjusted pulse shape and output a pulse setpoint profile in accordance with the adjusted pulse shape, the pulse setpoint profile including a RF parameter setpoint for controlling a RF power source. The at least one control signal varies in accordance with the RF parameter setpoint for controlling a RF power source. The amplitude of the RF signal varies in accordance with at least one of an amplitude of the at least one control signal or an amplitude of a rail voltage applied to the RF power source, and where the respective feedforward adjustments vary at least one of the amplitude of the at least one control signal or the amplitude of the rail voltage applied to the RF power source. The amplitude, the frequency, or the impedance is adjusted in accordance with a feedback signal that varies in accordance with a RF parameter sensed between the matching network and the load. The non-transitory computer-readable medium wherein the instructions may include communicating the respective pulse parameter sensed between a matching network and a load between a post-match sensor and a RF control module using one of an analog or a digital communication link. The digital communication link includes at least one of a System Bus Datalink, an Ethernet Industrial Bus, a Transmission Control Protocol (TCP), a User Datalink Protocol (UDP), a fiber optic link, or a gigabit transceiver datalink. The non-transitory computer-readable medium wherein the instructions may include determining the respective feedforward adjustments in accordance with parameters generated by one of a plant model or an inverse plant model that describes a variation of the pulse signal as it propagates from a RF generator to the load. Implementations of the described techniques may include hardware, a method or process, or computer software on a computer-accessible medium.

One general aspect includes a method for controlling a RF signal. The method also includes generating a RF output signal to a load. The method also includes generating a control signal to vary the RF output signal, where the RF output signal includes a RF signal modulated by a pulse signal. The method also includes adjusting the control signal to vary at least one of an amplitude or a frequency of the RF output signal or an impedance between a RF power source and a load to control a shape of the pulse signal. The method also includes adjusting at least one of the amplitude, the frequency, or the impedance in accordance with respective feedforward adjustments that vary in accordance with a respective pulse parameter sensed between a matching network and a load. Other embodiments of this aspect include corresponding computer systems, apparatus, and computer programs recorded on one or more computer storage devices, each configured to perform the actions of the methods.

Implementations may include one or more of the following features. The method may include varying at least one of the amplitude, the frequency, or the impedance in accordance with one of forward power, reverse, power, delivered power, or a reflection coefficient. The amplitude of the RF signal varies in accordance with at least one of an amplitude of the control signal or an amplitude of a rail voltage applied to a RF power source. The respective feedforward adjustments vary at least one of the amplitude of the control signal or the amplitude of the rail voltage applied to the RF power source. At least one of the amplitude, the frequency, or the impedance are further adjusted in accordance with a feedback signal that varies in accordance with a respective RF parameter sensed between the matching network and the load. The method may include receiving a requested pulse shape including at least one pulse setpoint parameter and receiving the respective pulse parameter and adjusting the at least one pulse setpoint parameter in accordance with the respective pulse parameter to output an adjusted pulse shape. The method may include receiving the adjusted pulse shape and output a pulse setpoint profile in accordance with the adjusted pulse shape, the pulse setpoint profile including at least one RF parameter setpoint for controlling a RF power source. The method may include communicating the respective pulse parameter sensed between a matching network and a load between a post-match sensor using a one of an analog or digital communication link. The method may include determining the respective feedforward adjustments in accordance with parameters generated by one of a plant model or an inverse plant model that describes a variation of the pulse signal as it propagates to the load. Implementations of the described techniques may include hardware, a method or process, or computer software on a computer-accessible medium.

One general aspect includes a RF generator having a RF power source. The generator also includes a RF control module coupled to the RF power source and configured to generate at least one control signal to vary at least one of an RF output signal output by the RF power source or an impedance between the RF power source and a load, where the RF output signal includes a RF signal modulated by a pulse signal, and the RF control module is further configured to adjust the at least one control signal to vary at least one of an amplitude or a frequency of the RF output signal or an impedance between the RF power source and the load to control a shape of the pulse signal. The generator also includes a digital communication link between the RF control module and a sensor disposed between a matching network and a load, where a respective sensed pulse parameter detected by the sensor is communicated from the sensor to the RF power source via the digital communication link. The generator also includes where at least one of the amplitude, the frequency, or the impedance is adjusted in accordance with respective feedforward adjustments that vary in accordance with the respective sensed pulse parameter. Other embodiments of this aspect include corresponding computer systems, apparatus, and computer programs recorded on one or more computer storage devices, each configured to perform the actions of the methods.

Implementations may include one or more of the following features. The RF generator where the respective feedforward adjustments vary at least one of the amplitude, the frequency, or the impedance in accordance with one of forward power, reverse, power, delivered power, or a reflection coefficient. The amplitude of the RF signal varies in accordance with at least one of an amplitude of the at least one control signal or an amplitude of a rail voltage applied to the RF power source. The respective feedforward adjustments vary at least one of the amplitude of the at least one control signal or the amplitude of the rail voltage applied to the RF power source. The RF control module is further configured to further adjust at least one of the amplitude, the frequency, or the impedance in accordance with a RF signal parameter sensed between the RF power source and the matching network, where the at least one of the amplitude, the frequency, or the impedance is adjusted in accordance with at least one respective feedback signal that varies in accordance with a RF parameter sensed between the matching network and the load. The respective feedforward adjustments adjust at least one of a setpoint or an actuator. The RF control module further may include a setpoint modifier configured to receive a requested pulse shape including at least one pulse setpoint parameter and to receive the respective sensed pulse parameter and adjusting the at least one pulse setpoint parameter in accordance with the respective sensed pulse parameter to output an adjusted pulse shape. The RF control module further may include a pulse synthesizer configured to receive the adjusted pulse shape and output a pulse setpoint profile in accordance with the adjusted pulse shape, the pulse setpoint profile including a RF parameter setpoint for controlling the RF power source. The at least one control signal varies in accordance with the RF parameter setpoint for controlling the RF power source. The amplitude of the RF signal varies in accordance with at least one of an amplitude of the at least one control signal or an amplitude of a rail voltage applied to the RF power source. The respective feedforward adjustments vary at least one of the amplitude of the at least one control signal or the amplitude of the rail voltage applied to the RF power source. The RF control module is further configured to further adjust at least one of the amplitude, the frequency or the impedance in accordance with a RF signal parameter sensed between the RF power source and the matching network, where the amplitude, the frequency, or the impedance of the RF signal is adjusted in accordance with a respective feedback signal that varies in accordance with a RF parameter sensed between the matching network and the load. The digital communication link includes at least one of a System Bus Datalink, an Ethernet Industrial Bus, a Transmission Control Protocol (TCP), a User Datalink Protocol (UDP), a fiber optic link, or a gigabit transceiver datalink. The respective feedforward adjustments are determined in accordance with parameters generated by one of a plant model or an inverse plant model that describes a variation of the pulse signal as it propagates from the RF generator to the load. Implementations of the described techniques may include hardware, a method or process, or computer software on a computer-accessible medium.

One general aspect includes a non-transitory computer-readable medium storing instructions. The non-transitory computer-readable medium storing instructions also includes generating a RF output signal to a load. The instructions also include generating at least one control signal to vary the RF output signal or an impedance between a RF power source and a load, where the RF output signal includes a RF signal modulated by a pulse signal. The instructions also include digitally communicating a pulse parameter sensed by a sensor disposed between a matching network and a load, where the pulse parameter is communicated from the sensor to a RF power source via a digital communication link. The instructions also include adjusting the at least one control signal to vary at least one of an amplitude or a frequency of the RF output signal or the impedance between the RF power source and a load to control a shape of the pulse signal. The instructions also include adjusting at least one of the amplitude, the frequency or the impedance in accordance with respective feedforward adjustments that vary in accordance with the pulse parameter. Other embodiments of this aspect include corresponding computer systems, apparatus, and computer programs recorded on one or more computer storage devices, each configured to perform the actions of the methods.

Implementations may include one or more of the following features. The non-transitory computer-readable medium where the respective feedforward adjustments vary at least one of the amplitude, the frequency, or the impedance in accordance with one of forward power, reverse, power, delivered power, reflected power, or a reflection coefficient. The amplitude of the RF signal varies in accordance with at least one of an amplitude of the at least one control signal or an amplitude of a rail voltage applied to the RF power source. The respective feedforward adjustments vary at least one of the amplitude of the at least one control signal or the amplitude of the rail voltage applied to the RF power source. At least one of the amplitude, the frequency, or the impedance of the RF signal are further adjusted in accordance with a respective feedback signal that varies in accordance with a RF parameter sensed between the matching network and the load. The respective feedforward adjustments adjust at least one of a setpoint or an actuator. The non-transitory computer-readable medium wherein the instructions may include receiving a requested pulse shape including at least one pulse setpoint parameter and receiving the pulse parameter and adjusting the at least one pulse setpoint parameter in accordance with the pulse parameter to output an adjusted pulse shape. The non-transitory computer-readable medium wherein the instructions may include receiving the adjusted pulse shape and output a pulse setpoint profile in accordance with the adjusted pulse shape, the pulse setpoint profile including at least one RF parameter setpoint for controlling a RF power source. The at least one control signal varies in accordance with the at least one RF parameter setpoint for controlling the RF power source. The amplitude of the RF signal varies in accordance with at least one of an amplitude of the at least one control signal or an amplitude of a rail voltage applied to the RF power source, and where the respective feedforward adjustments vary at least one of the amplitude of the at least one control signal or the amplitude of the rail voltage applied to the RF power source. The amplitude, the frequency, or the impedance is adjusted in accordance with a feedback signal that varies in accordance with a RF parameter sensed between the matching network and the load. The non-transitory computer-readable medium wherein the instructions may include communicating the pulse parameter sensed between a matching network and a load between a post-match sensor and a RF control module using a digital communication link. The digital communication link includes at least one of a System Bus Datalink, an Ethernet Industrial Bus, a Transmission Control Protocol (TCP), a User Datalink Protocol (UDP), a fiber optic link, or a gigabit transceiver datalink. The non-transitory computer-readable medium wherein the instructions may include determining the respective feedforward adjustments in accordance with parameters generated by one of a plant model or an inverse plant model that describes a variation of the pulse signal as it propagates to the load. Implementations of the described techniques may include hardware, a method or process, or computer software on a computer-accessible medium.

One general aspect includes a method for controlling a RF signal. The method also includes generating a RF output signal to a load. The method also includes generating a control signal to vary the RF output signal, where the RF output signal includes a RF signal modulated by a pulse signal. The method also includes digitally communicating a respective pulse parameter sensed by a sensor disposed between a matching network and a load, where the respective pulse parameter is communicated from the sensor to a RF power source via a digital communication link. The method also includes adjusting the control signal to vary at least one of an amplitude or a frequency of the RF output signal or an impedance between the RF power source and a load to control a shape of the pulse signal. The method also includes adjusting at least one of the amplitude, the frequency, or the impedance of the pulse signal in accordance with respective feedforward adjustments that vary in accordance with the respective pulse parameter. Other embodiments of this aspect include corresponding computer systems, apparatus, and computer programs recorded on one or more computer storage devices, each configured to perform the actions of the methods.

Implementations may include one or more of the following features. The method may include varying at least one of the amplitude, the frequency, or the impedance in accordance with one of forward power, reverse, power, delivered power, reflected power, or a reflection coefficient. The amplitude of the RF signal varies in accordance with at least one of an amplitude of the control signal or an amplitude of a rail voltage applied to the RF power source. The respective feedforward adjustments vary at least one of the amplitude of the control signal or the amplitude of the rail voltage applied to the RF power source. At least one of the amplitude, the frequency, or the impedance is adjusted in accordance with a feedback signal that varies in accordance with a respective RF parameter sensed between the matching network and the load. The method may include receiving a requested pulse shape including at least one pulse setpoint parameter and receiving the respective pulse parameter and adjusting the at least one pulse setpoint parameter in accordance with the respective pulse parameter to output an adjusted pulse shape. The method may include receiving the adjusted pulse shape and output a pulse setpoint profile in accordance with the adjusted pulse shape, the pulse setpoint profile including at least one RF parameter setpoint for controlling a RF power source. The respective feedforward adjustments adjust at least one of a setpoint or an actuator. The method may include communicating the respective pulse parameter sensed between a matching network and a load between a post-match sensor and a RF control module using a digital communication link. The method may include determining the respective feedforward adjustments in accordance with parameters generated by one of a plant model or an inverse plant model that describes a variation of the pulse signal as it propagates to the load. Implementations of the described techniques may include hardware, a method or process, or computer software on a computer-accessible medium.

One general aspect includes a RF generator having a RF power source. The generator also includes a RF control module coupled to the RF power source and configured to generate at least one control signal to vary at least one of an RF output signal output by the RF power source or an impedance between the RF power source and a load, where the RF output signal includes a RF signal modulated by a pulse signal, and the RF control module is further configured to adjust the at least one control signal to vary at least one of an amplitude or a frequency of the RF output signal or the impedance between the RF power source and a load to control a shape of the pulse signal. The generator also includes one of a plant model module or an inverse plant model module. The generator also includes where at least one of the amplitude, the frequency, or the impedance of the pulse signal is adjusted in accordance with respective feedforward signals that vary in accordance with a respective pulse parameter sensed between a matching network and the load. The generator also includes where the respective feedforward signals are determined in accordance with parameters generated by one of the plant model module or the inverse plant model module. Other embodiments of this aspect include corresponding computer systems, apparatus, and computer programs recorded on one or more computer storage devices, each configured to perform the actions of the methods.

Implementations may include one or more of the following features. The RF generator where the plant model module generates a plant model in accordance with a variation of the pulse signal introduced by a plant, and the inverse plant model module generates an inverse plant model in accordance with an inverse of the variation of the pulse signal introduced by a plant. The plant model module receives a pulse profile from the RF control module and a difference between a modeled pulse profile output by the plant model module and the respective pulse parameter. The RF generator may include a delay module disposed between the RF control module and the plant model module, the delay module introducing a predetermined delay in the pulse signal in order to synchronize the pulse signal with the modeled pulse profile output by the plant model module. The inverse plant model module receives the respective pulse parameter and a difference between a pulse profile from the RF control module and a modeled adaptive inverse pulse profile output by the inverse plant model module. The RF control module includes a copy of the inverse plant model generated by the inverse plant model module, and the respective feedforward signals apply an inverse of the plant model to the pulse signal. The respective feedforward signals vary at least one of the amplitude, the frequency, or the impedance in accordance with one of forward power, reverse, power, delivered power, reflected power, or a reflection coefficient. The amplitude of the RF signal varies in accordance with at least one of an amplitude of the at least one control signal or an amplitude of a rail voltage applied to the RF power source. The respective feedforward signals vary at least one of the amplitude of the at least one control signal or the amplitude of the rail voltage applied to the RF power source. The RF control module is further configured to further adjust at least one of the amplitude, the frequency, or the impedance in accordance with a RF signal parameter sensed between the RF power source and the matching network, where at least one of the amplitude, the frequency, or the impedance of the RF signal is adjusted in accordance with a respective feedback signal that varies in accordance with a RF parameter sensed between the matching network and the load. The respective feedforward signals adjust at least one of a setpoint or an actuator. The respective pulse parameter sensed between a matching network and a load is communicated between a post-match sensor and the RF control module using one of an analog or a digital communication link. Implementations of the described techniques may include hardware, a method or process, or computer software on a computer-accessible medium.

One general aspect includes a non-transitory computer-readable medium storing instructions. The non-transitory computer-readable medium storing instructions also includes generating a RF output signal to a load. The instructions also include generating at least one control signal to vary the RF output signal or an impedance between a RF power source and a load, where the RF output signal includes a RF signal modulated by a pulse signal. The instructions also include sensing a respective pulse parameter between a matching network and a load. The instructions also include determining respective feedforward adjustments to the at least one control signal in accordance with one of a plant model or an inverse plant model, where the one of a plant model or an inverse plant model varies in accordance with respective pulse parameter. The instructions also include applying the respective feedforward adjustments to the at least one control signal to vary at least one of an amplitude or a frequency, or an impedance of the RF output signal to control a shape of the pulse signal. Other embodiments of this aspect include corresponding computer systems, apparatus, and computer programs recorded on one or more computer storage devices, each configured to perform the actions of the methods.

Implementations may include one or more of the following features. The non-transitory computer-readable medium where the plant model receives a pulse profile and a difference between a modeled pulse profile output by the plant model and the respective pulse parameter. The non-transitory computer-readable medium the instructions further delaying the pulse profile in order to synchronize the pulse profile with the modeled pulse profile. The inverse plant model receives the respective pulse parameter and a difference between a pulse profile and a modeled adaptive inverse pulse profile output by the inverse plant model. The non-transitory computer-readable medium wherein the instructions may include copying the inverse plant model and varying the respective feedforward adjustments to apply an inverse of the plant model to the pulse signal. The respective feedforward adjustments vary at least one of the amplitude, the frequency, or the impedance in accordance with one of forward power, reverse, power, delivered power, reflected power, or a reflection coefficient. The amplitude of the RF signal varies in accordance with at least one of an amplitude of the at least one control signal or an amplitude of a rail voltage applied to a RF power source. The respective feedforward adjustments vary at least one of the amplitude of the at least one control signal or the amplitude of the rail voltage applied to the RF power source. The amplitude, the frequency, or the impedance is adjusted in accordance with a respective feedback signal that varies in accordance with a RF parameter sensed between the matching network and the load. The respective feedforward adjustments adjust at least one of a setpoint or an actuator. The respective pulse parameter sensed between a matching network and a load is communicated between a post-match sensor and a RF control module using one of an analog or a digital communication link. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
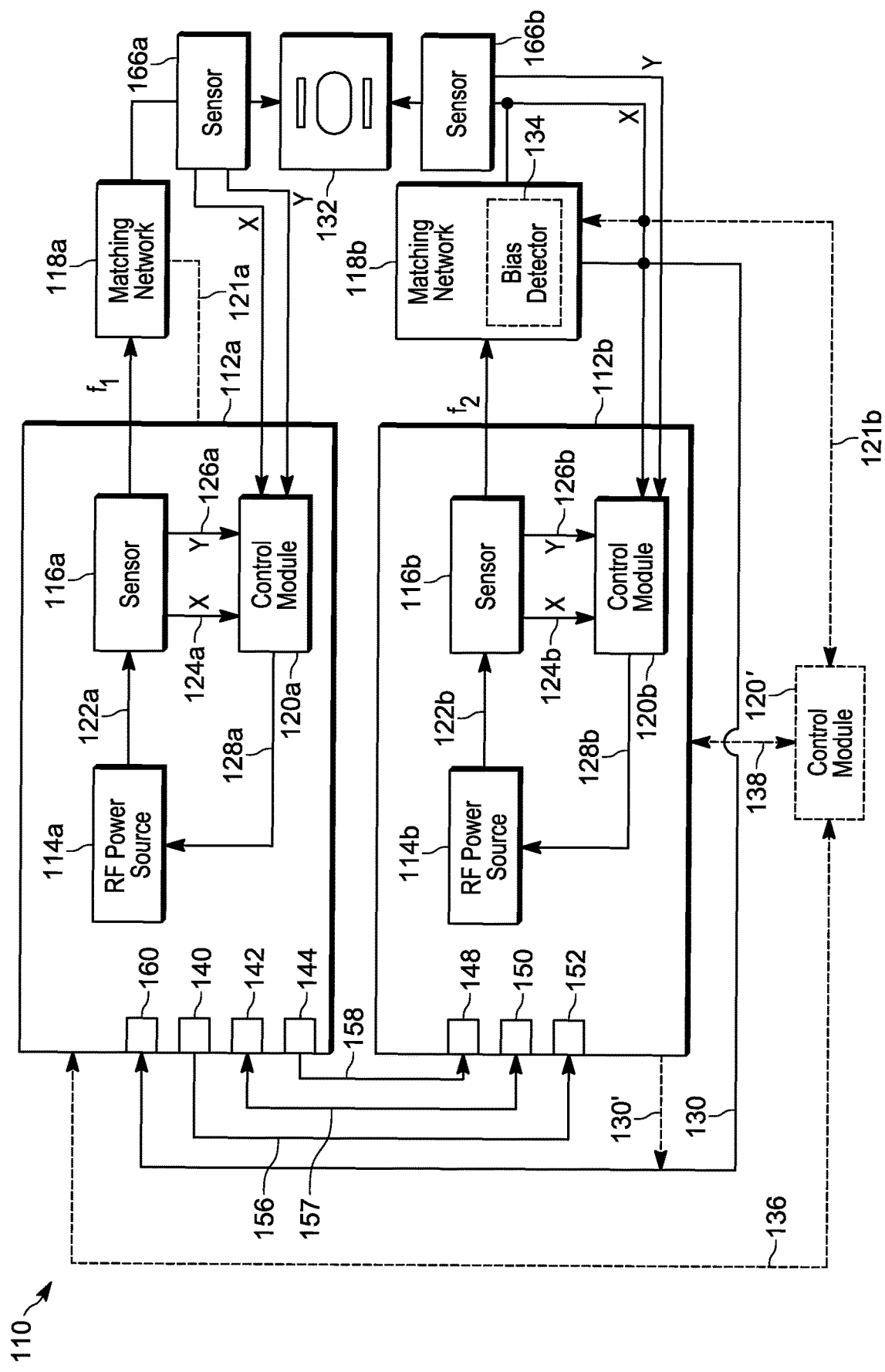
FIG. 1 is a schematic diagram of a power delivery system having multiple power supplies arranged according to various embodiments of the present disclosure.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). Forward power may be maximized and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal or pulse signal in order to define an envelope for the modulated power signal. The RF signal may be, for example, a sinusoidal RF signal or other time varying signal. Power delivered to the load is typically varied by varying the modulation signal or pulse signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The IEDF can be controlled with the bias power. One way of controlling the IEDF for a system in which multiple RF power signals are applied to the load occurs by varying multiple RF signals that are related by amplitude, frequency and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding IEDF.

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts a RF generator or power supply system 110. Power supply system 110 includes a pair of radio frequency (RF) generators 112a, 112b, also referred to as power supplies, matching networks 118a, 118b, and load 132, such as a non-linear load, which may be a plasma chamber, process chamber, and the like. In various embodiments, RF generator 112a is referred to as a source RF generator or power supply, and matching network 118a is referred to as a source matching network. Also in various embodiments, RF generator 112b is referred to as a bias RF generator or power supply, and matching network 118b is referred to as a bias matching network. It will be understood that the components can be referenced individually or collectively using the reference number without a letter subscript or a prime symbol.

In various embodiments, source RF generator 112a receives a control signal 130 from matching network 118b, generator 112b, or a control signal 130' from bias RF generator 112b. As will be explained in greater detail, control signal 130 or 130' represent an input signal to source RF generator 112a that indicates one or more operating characteristics or parameters of bias RF generator 112b. In various embodiments, a synchronization bias detector 134 senses the RF signal output from matching network 118b to load 132 and outputs a synchronization or trigger signal 130 to source RF generator 112a. In various embodiments, synchronization or trigger signal 130' may be output from bias RF generator 112b to source RF generator 112a, rather than trigger signal 130. A difference between trigger or synchronization signals 130, 130' may result from the effect of matching network 118b, which can adjust the phase between the input signal to and output signal from matching network. Signals 130, 130' include information about the operation of bias RF generator 112b that in various embodiments enables predictive responsiveness to address periodic fluctuations in the impedance of load 132 caused by the bias RF generator 112b. When control signals 130 or 130' are absent, RF generators 112a, 112b operate autonomously.

RF generators 112a, 112b include respective RF power sources 114a, 114b, also referred to as power sources, power amplifiers, or RF power amplifiers, RF sensors 116a, 116b, and control modules 120a, 120b, also referred to as controllers or processors. RF power sources 114a, 114b generate respective RF power signals 122a, 122b output to respective sensors 116a, 116b. Sensors 116a, 116b receive the output of RF power sources 114a, 114b and generate respective RF output signals or RF power signals $f_1$ and $f_2$. Sensors 116a, 116b output signals that vary in accordance with various parameters sensed from load 132. While sensors 116a, 116b, are shown within respective RF generators 112a, 112b, RF sensors 116a, 116b can be located externally to the RF power generators 112a, 112b, such as post-match sensors 166a, 166b, disposed between respective matching networks 118a, 118b and load 132. Such external sensing can occur at the output of the RF generator, at the input of an impedance matching device located between the RF generator and the load, or between the output of the impedance matching device (including within the impedance matching device) and the load. In various configurations, the closer that a sensor can be placed in proximity to the load, the more accurate and repeatable the RF power delivery functions can be, such as power delivery, pulse shaping, and impedance matching.

Sensors 116a, 116b, 166a, 166b detect various operating parameters and output signals X and Y. Sensors 116a, 116b, 166a, 166b may include voltage, current, and/or directional coupler sensors. Sensors 116a, 116b, 166a, 166b may detect (i) voltage V and current I and/or (ii) forward power $P_{FWD}$ output from respective RF power sources 114a, 114b and/or RF generators 112a, 112b and reverse or reflected power $P_{REV}$ received from respective matching network 118a, 118b or load 132 connected to respective sensors 116a, 116b, 166a, 166b. The sensors can also measure the phase angle between the current and voltage waveforms and/or the phase angle between the forward and reflected voltage signals. Either of these methods can be used to determine the complex impedance at the operating frequency and/or at harmonics of the operating frequency. The voltage V, current I, forward power $P_{FWD}$, and reverse power $P_{REV}$ may be scaled, filtered, or scaled and filtered versions of the actual voltage, current, forward power, and reverse power associated with the respective RF power sources 114a, 114b. Sensors 116a, 116b, 166a, 166b may be analog or digital sensors or a combination thereof. In a digital implementation, the sensors 116a, 116b, 166a, 166b may include analog-to-digital (A/D) converters and signal sampling components with corresponding sampling rates. Signals X and Y can represent any of the voltage V and current I; forward (or source) power $P_{REV}$ reverse (or reflected) power $P_{REV}$ or other parameters, such as the reflection coefficient gamma (Γ). In various configurations, internal sensors 116a, 116b may have the same operations as post match sensors 166a, 166b. Post-match sensors 166a, 166b may require specific calibrations due to the different impedance seen at the post match position. In various configurations, for the purpose of pulse shaping, samples of the pulse are consecutively collected and packetized for transmission digitally to the controller so that the controller has an accurate representation of all parts of the pulse. In various other configurations, each sample may be indexed from a common synchronization signal so that the pulse feedback information can be reconstructed after digital data transmission, In the case of analog transmissions, these techniques would not be needed. In various other configurations, some form of pre-match sensor 116a, 116b may be required for generator protection. This pre-match sensor may also assist with impedance matching so that the generator stress is less and power delivery capability is increased.

Sensors 116a, 116b, 166a, 166b, generate sensor signals X, Y, which are received by respective control modules 120a, 120b, also referred to as power controllers. Control modules 120a, 120b process the respective X, Y signals 124a, 126a and 124b, 126b and generate one or a plurality of feedforward or feedback control signals 128a, 128b to respective RF power sources 114a, 114b. RF power sources 114a, 114b adjust the RF power signals 122a, 122b based on the one or plurality feedback or feedforward control signal. In various embodiments, control modules 120a, 120b may control matching networks 118a, 118b, respectively, via respective control signals 121a, 121b. Control modules 120a, 120b may include, at least, proportional integral derivative (PID) controllers or subsets thereof and/or direct digital synthesis (DDS) component(s) and/or any of the various components described below in connection with the modules.

In various embodiments, control modules 120a, 120b are PID controllers or subsets thereof and may include functions, processes, processors, modules, or submodules. Control signals 128a, 128b may be drive signals and may include DC offset or rail voltage, voltage or current magnitude, frequency, and phase components. In various embodiments, feedback control signals 128a, 128b can be used in one or multiple control loops. In various embodiments, the multiple control loops can include a proportional-integral-derivative (PID) control loop for RF drive, and for rail voltage. In various embodiments, control signals 128a, 128b can be used in a Single Input Single Output (SISO) or a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other embodiments, signals 128a, 128b can provide feedforward control as described in U.S. Pat. No. 10,049,857, assigned to the assignee of the present application and incorporated by reference herein.

In various embodiments, power supply system 110 can include control module 120', also referred to as a power control module. Control module 120' may be disposed externally to either or both of RF generators 112a, 112b and may be referred to as external or common controller 120'. In various embodiments, control module 120' may implement one or a plurality of functions, processes, or algorithms described herein with respect to one or both of control modules 120a, 120b. Accordingly, control module 120' communicates with respective RF generators 112a, 112b via a pair of respective links 136, 138 which enable exchange of data and control signals, as appropriate, between control module 120' and RF generators 112a, 112b. For the various embodiments, control modules 120a, 120b, 120' can distributively and cooperatively provide analysis and control with of RF generators 112a, 112b. In various other embodiments, control module 120' can provide analysis and control of RF generators 112a, 112b, eliminating the need for the respective local control modules 120a, 120b.

In various embodiments, RF power source 114a, sensor 116a, 166a, control module 120a, and matching network 118a can be referred to as source RF power source 114a, source sensor 116a, 166a, source control module 120a, and source matching network 118a. Similarly in various embodiments, RF power source 114b, sensor 116b, 166b, control module 120b, and matching network 118b can be referred to as bias RF power source 114b, bias sensor 116b, 166b, bias control module 120b, and bias matching network 118b. In various embodiments and as described above, the source term refers to the RF generator that generates a plasma, and the bias term refers to the RF generator that tunes the plasma Ion Energy Distribution Function (IEDF). In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

According to various embodiments, source RF generator 112a and bias RF generator 112b include multiple ports to communicate externally. Source RF generator 112a includes pulse synchronization output port 140, digital communication port 142, and RF output port 144. Bias RF generator 112b includes RF input port 148, digital communication port 150, and pulse synchronization input port 152. Pulse synchronization output port 140 outputs pulse synchronization signal 156 to pulse synchronization input port 152 of bias RF generator 112b. Digital communication port 142 of source RF generator 112a and digital communication port 150 of bias RF generator 112b communicate via a digital communication link 157. RF output port 144 generates RF control signal 158 input to RF input port 148. In various embodiments, RF control signal 158 is substantially the same as the RF control signal controlling source RF generator 112a. In various other embodiments, RF control signal 158 is the same as the RF control signal controlling source RF generator 112a, but is phase shifted within source RF generator 112a in accordance with a requested phase shift generated by bias RF generator 112b. Thus, in various embodiments, source RF generator 112a and bias RF generator 112b are driven by substantially identical RF control signals or by substantially identical RF control signal phase shifted by a predetermined amount.

Figure 2:
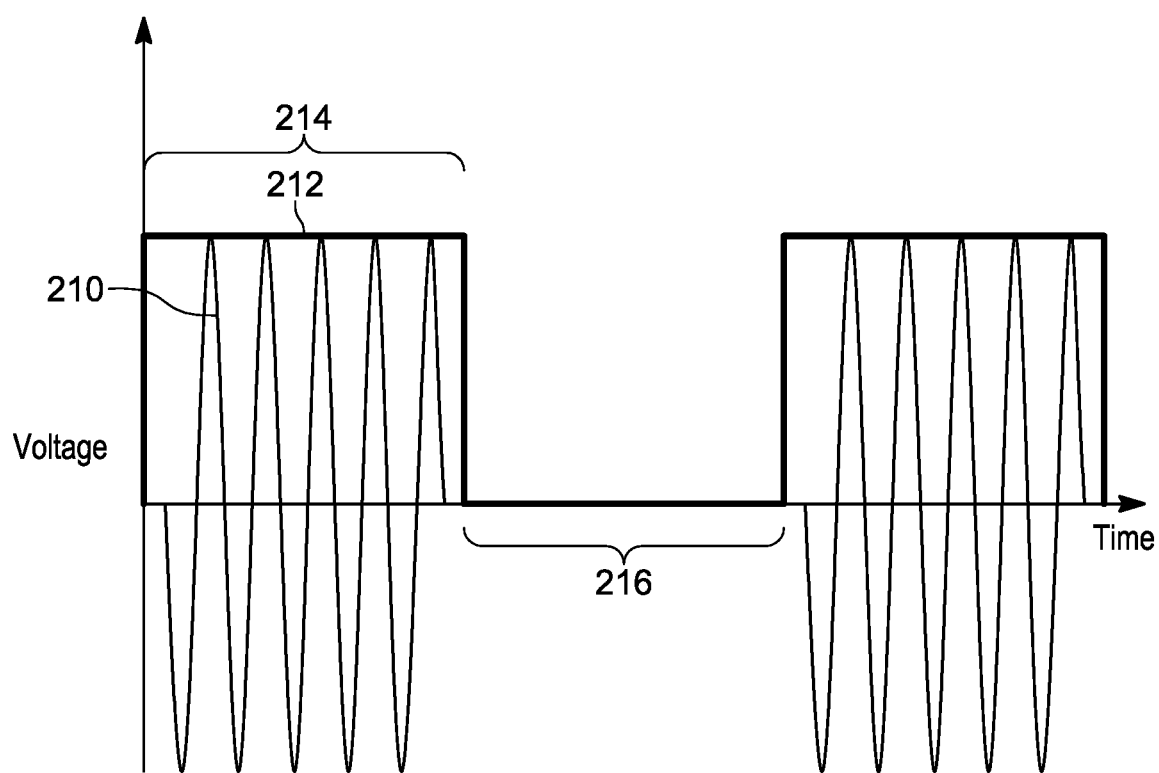
FIG. 2 shows waveforms of a RF signal and a pulse modulating the RF signal.

FIG. 2 depicts a plot of voltage versus time to describe a pulse mode of operation for delivering power to a load, such as load 132 of FIG. 1. In FIG. 2, RF signal 210 is modulated by pulse 212. As shown at period or region 214 of pulse 212, when pulse 212 is ON, RF generator 112 outputs RF signal 210. Conversely, during period or region 216 of pulse 212, pulse 212 is OFF, and RF generator 112 does not output RF signal 210. Pulse 212 can repeat at a constant duty cycle or a variable duty cycle. Further, pulse 212 need not be a square wave as shown in FIG. 2. By way of non-limiting example, pulse 212 may be trapezoidal, triangular, Gaussian, or multi-state. The pulse may have a predetermined period and may repeat over each period or vary from period to period. Further yet, pulse 212 can have multiple ON and OFF regions of varying amplitude and duration. The multiple regions may repeat within a fixed or variable period to define a fixed, variable, or arbitrary envelope for the RF signal.

Figure 3:
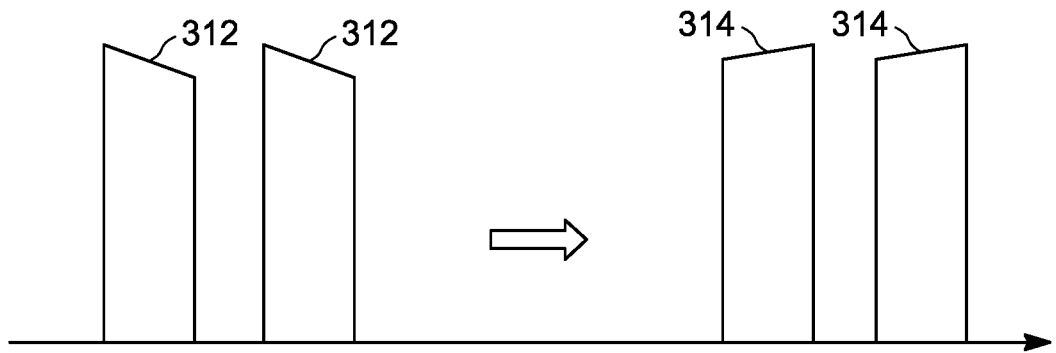
FIG. 3 shows pulse shapes for a RF generator using a conventional approach to pulse shape generation.

With reference to FIG. 3, FIG. 3 shows a typical pulse shape at the plasma chamber and how the pulse shape changes over time. Pulses 312 have a first shape at a given point in time. After a preselected time, such as 500 hours, the shape of pulses 312 drifts to the shape of pulses 314. The change in pulse shapes from pulses 312 to pulses 314 can negatively impact production of the plasma chamber. It should be noted that pulses 312, 314 are indicative of the pulses measured at a load, such as a plasma chamber. Measuring pulses away from the load, such as prior to a matching network, may not provide as accurate a representation of pulses delivered to the load. For various plasma operations, the shape of pulses 312, 314 may not be considered optimal.

Figure 4:
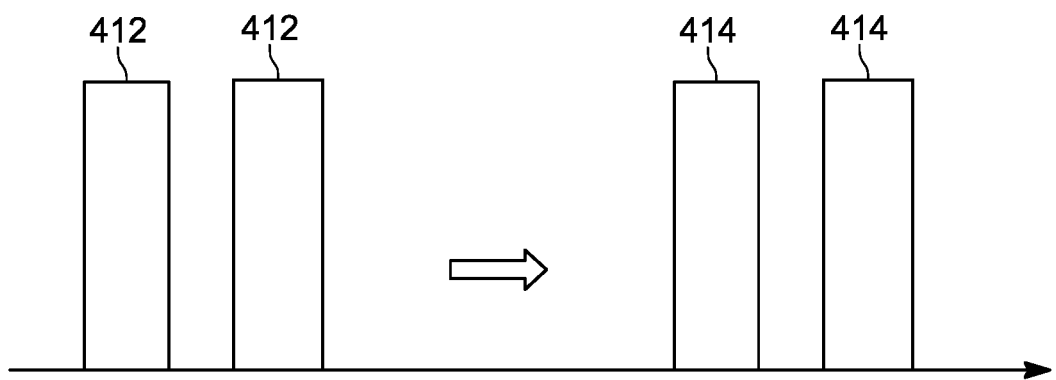
FIG. 4 shows waveforms of an ideal pulse shape for an RF generator.

FIG. 4 shows pulses 412 at a first point in time having a preferred shape for a predetermined plasma operation. As can be seen in FIG. 4, the shape of the pulses remains generally consistent over time, as shown by pulses 414. In various configurations, pulse shapes may be compared over 500 hours. Thus, pulses 412 represent a generally preferred pulse shape for selected plasma operations, and pulses 414 indicate consistency of the preferred pulse shapes over time.

One approach to enabling a RF generation system to output optimal pulse shapes to a load, such as a plasma chamber, includes using a closed-loop system with the sensor located between the matching network and the plasma chamber, such as shown by sensors 166a, 166b of FIG. 1. However, conventional approaches are directed to controlling the pulse shape at the output of the RF generator, not the pulse shape between the matching network and the load. Reasons for placement of the RF sensor between the RF generator and the matching network include that a post-match sensor is typically customized to the plasma chamber or load and, in various configurations, can be less accurate than a RF sensor placed between the RF generator and the matching network. For example, a typical analog post-match voltage sensor may include generally high noise levels and ground loop/offset challenges. Post-match sensors are used to measure the amplitude of the voltage at the post-match node to adjust power up or down to achieve a voltage setpoint. Such traditional bias voltage leveling feedback has not been used for pulse shaping and his been limited to steady state RF voltage amplitude control. U.S. Pat. No. 941,480, assigned to the assignee of the present application and incorporated by reference in this application, describes a virtual sensor which estimates post-match node values using s-parameter transformations. While the approach presented in the cited patent provides various improvements, the post-match node values may be susceptible to matching network manufacturing variation and temperature.

In various configurations, the subject matter described herein combines one or a number of elements to provide improved pulse shaping control, including a post-match sensor to measure the pulse, a digitally implemented control loop that provides values from a post-match sensor to a RF generator controller via a digital communications link, and adaptive plant models to provide setpoint adjustments to shape the pulses using feedforward control.

In various embodiments, the RF power generation system of the present disclosure receives input defining a desired pulse shape and compares the desired pulse shape with the current pulse shape measured at a post-match sensor. The RF power generation system determines what pulse shape changes are required in order for the pulse shape measured by the post-match sensor to provide the desired pulse shape. The RF power generation system achieves the desired post-match pulse shape by controlling one or a plurality of amplitude and frequency of a power amplifier generating the output pulse. Amplitude control can include varying the amplitude of a control signal input to a power amplifier and the amplitude of the rail voltage applied to the power amplifier, as will be described herein. Controlling pulse shape in the manner described herein provides, at least, consistent short-term pulse shapes and improved long-term drift of the pulse shape.

In various configurations described herein, data from a post-match sensor need not be communicated to the pulse shaping components in real time since data is synchronized to the pulse and stored prior to transmission to the RF generator. Such an approach considers that the shape of the pulses is consistent over a shorter time period. Adjustments made to the pulse shape actuations by the RF generator leverage the sensor output for future pulse states, thereby improving and maintaining the pulse shape over time.

Figure 5:
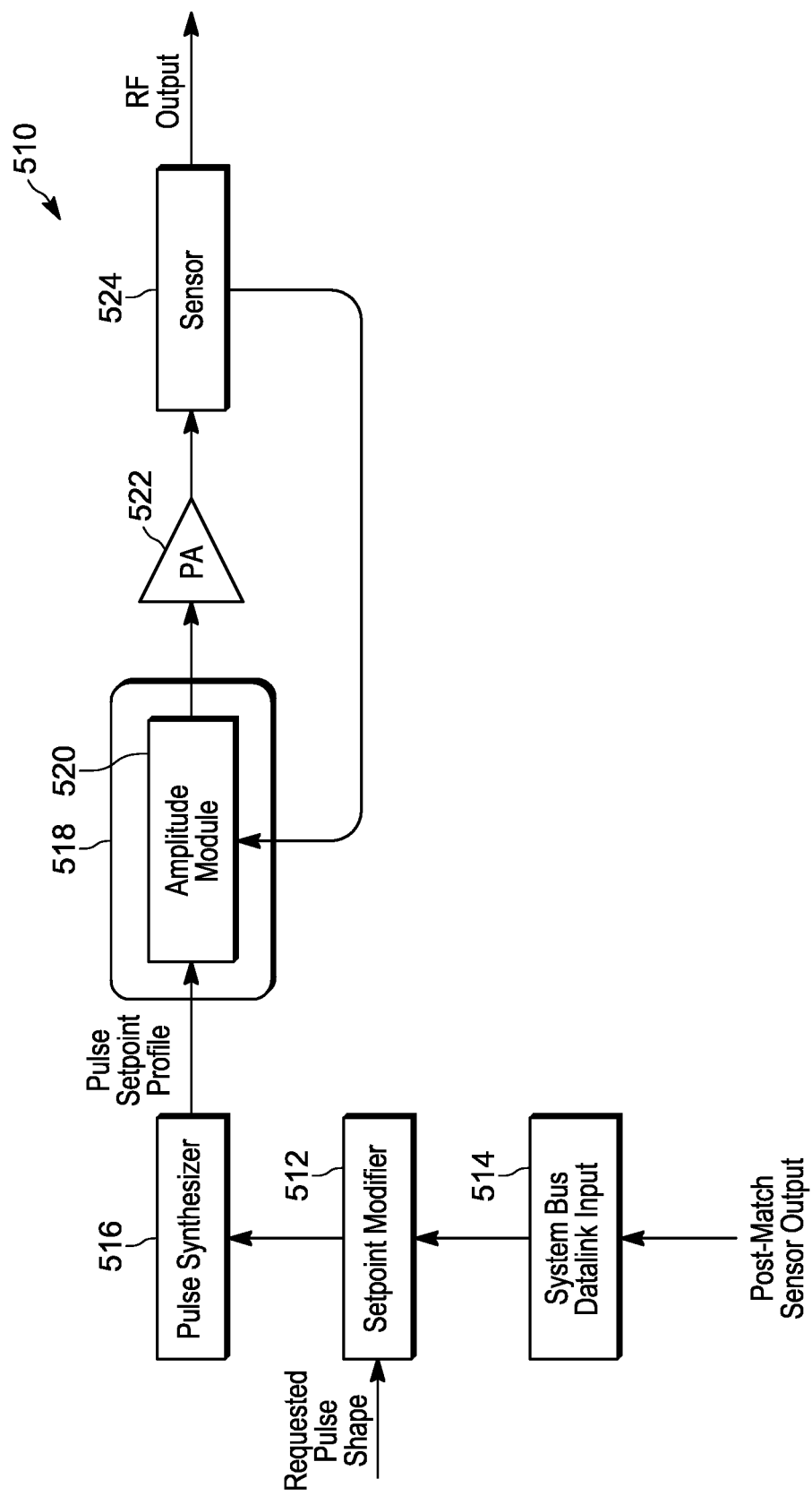
FIG. 5 shows a block diagram of a RF generation system using amplitude control arranged in accordance with the present disclosure.

FIG. 5 shows a block diagram of a RF generation system 510, in which a requested pulse shape is input to a setpoint modifier 512. The requested pulse shape includes one or a plurality of pulse setpoints for pulse parameters defining the shape of the pulse, including amplitude, frequency, rise times, fall times, ramp time, RF phase angle, target impedance, total integrated energy over a pulse, overshoot, setting time, and quantities mathematically derived from these pulse parameters, for an entire period of one or a plurality sections of a repeating simple or repeating complex pulse. A system bus data link input 514 receives the post-match sensor output, such as from sensors 166a, 166b of FIG. 1. The post-match sensor output and the requested pulse shape are input to setpoint modifier module 512 which determines what changes should be made to the requested pulse shape to generate the desired pulse shape at the load, such as load 132 of FIG. 1. Setpoint modifier 512 applies the adjustments by modifying the setpoints for the pulse parameters and outputs the adjusted pulse shape parameters to pulse synthesizer 516. Pulse synthesizer 516 receives the adjusted pulse shape parameters and synthesizes a pulse setpoint. The pulse setpoint profile is input to RF control module 518, or RF power control module.

Control module 518 outputs a control signal to power amplifier 522. The control signal output to power amplifier 522 includes a frequency component and amplitude component which, when input to power amplifier 522 are amplified to generate a RF signal or RF output signal modulated by the requested pulse shape. The modulated RF signal is output to sensor 524. Sensor 524 generally corresponds to sensors 116a, 116b of FIG. 1. Sensor 524 outputs a RF signal to a matching network (not shown in FIG. 5), such as matching network 118a, 118b of FIG. 1. Control module 518 includes an amplitude module 520. As shown in FIG. 5, amplitude module 520 receives the pulse setpoint profile and generates an amplitude control signal that varies in accordance with the requested pulse shape.

Figure 6:
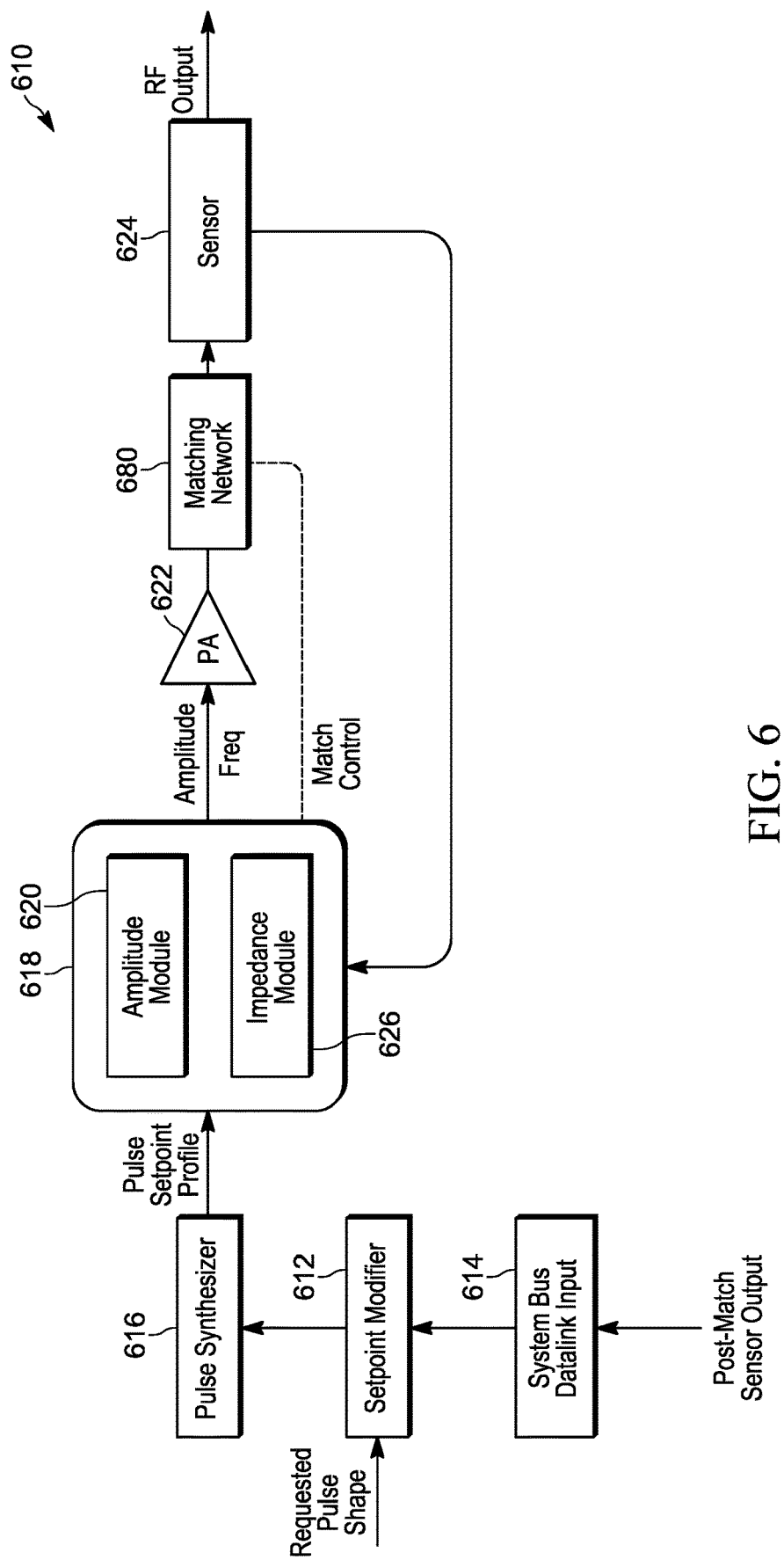
FIG. 6 shows a block diagram of a RF generation system using one or more of amplitude control, frequency control, and matching network arranged according to the present disclosure.

FIG. 6 shows a RF generation system 610 similarly configured to FIG. 5. RF generation system 610 operates similarly to the RF generation system 510 described in FIG. 5. Components in FIG. 6 that are similar to components of FIG. 5 will be numbered similarly, but will be preceded with a 6, rather than a 5. Such numbering will continue throughout the disclosure. RF control module 618 also includes impedance frequency module 626. Impedance module 626 controls an impedance match between power amplifier 622 of RF generator and a load by varying one or both of RF frequency, as shown in FIG. 5, or components of a matching network, as described in greater detail herein. Control module 618 generates the requested pulse shape by controlling both amplitude using the amplitude module 620 and frequency using impedance module 626. Thus, power amplifier 622 receives a control signal having an amplitude component and a frequency component, wherein both the amplitude component and the frequency component are varied in order to provide the requested pulse shape at the load. As described above, the pulse shape is achieved by controlling power amplifier 622 to generate the pulse such that when applied to the load, such as load 132 of FIG. 1, the pulse applied to the load 132 approximates the requested pulse shape.

As described above, impedance module 626 controls an impedance match between power amplifier 622 of a RF generator and a load by varying one or both of RF frequency or components of a matching network. FIG. 6 includes matching network 680 arranged between power amplifier 622 and sensor 624. Impedance module 626 outputs a match control signal to matching network 680. The match control signal may include commands for controlling one or more components of matching network 680, where the components may be one or more reactive components, such as a capacitor or an inductor for a tune or load reactance. The commands may be one or more control signals for controlling one or more actuators associated with respective one or more components of matching network 680. In other configurations, the commands may be analog or digital commands input to a matching network controller that converts the analog or digital commands into signals for controlling one or more actuators associated with respective one or more components of matching network 680.

Figure 7:
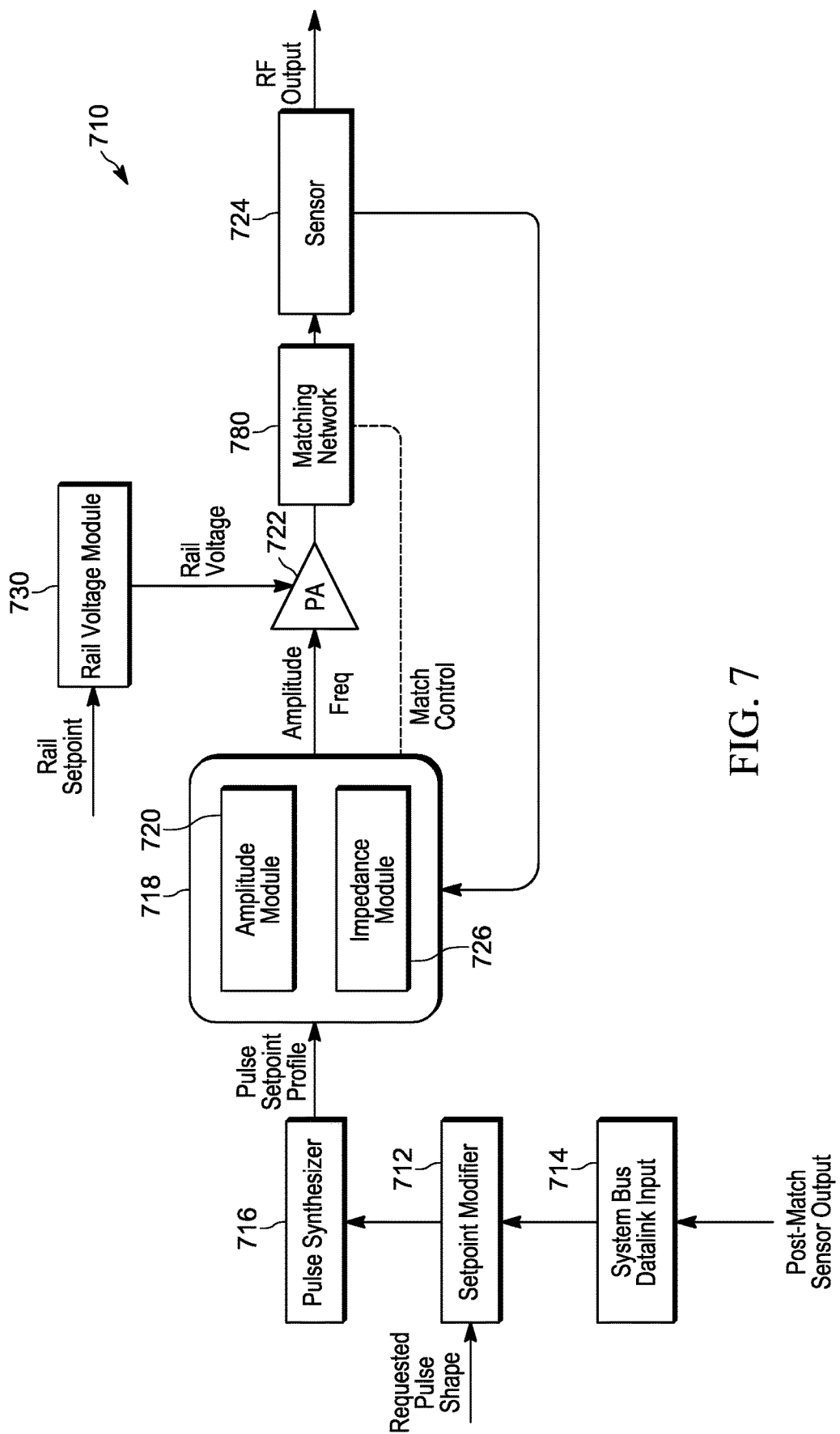
FIG. 7 shows a block diagram of a RF generation system using one or more of amplitude control, frequency control, matching network control, and rail voltage control arranged in accordance with the present disclosure.

FIG. 7 shows RF generation system 710 including RF control module 718 similar to FIG. 6 and also including rail voltage module 730. Rail voltage control module 730 can include one or more DC power supplies and a controller for controlling the one or more power supplies. The DC power suppliers and controller may be combined in a single module or may be one or more discrete components. Components of FIG. 7 similar to FIG. 6 are referred to using reference number beginning with a "7", rather than a "6". Such similar components may not be described in the specification. This convention will be used throughout this specification. Rail voltage module 730 receives a rail setpoint and generates a rail voltage to power amplifier 722. The rail voltage setpoint input to rail voltage module 730 can be received from the user, similarly to the source of the requested pulse shape, or maybe set by any of the controllers described above, such as one or a combination of control modules 120a, 120b, 120'. Rail voltage module 730 receives the rail setpoint and generates a rail voltage corresponding to the rail setpoint to power amplifier 722. In various configurations, the rail voltage may be configured to operate as low as practical in order to maintain efficiency of the operation of power amplifier 722. The amplitude signal input from control module 718 to power amplifier 722 controls the amplitude within a boundary set by the rail voltage output by rail voltage module 730. The operation of control module 718 to vary the amplitude of the input signal to power amplifier 722 provides improved response times verses varying the rail voltage applied to power amplifier 722. In various configurations, the rail voltage setpoint can be continuous, such as varying within a range of 30V-300V or discrete, such as 30V, 100V, 300V depending on the power amplifier architecture.

Figure 8:
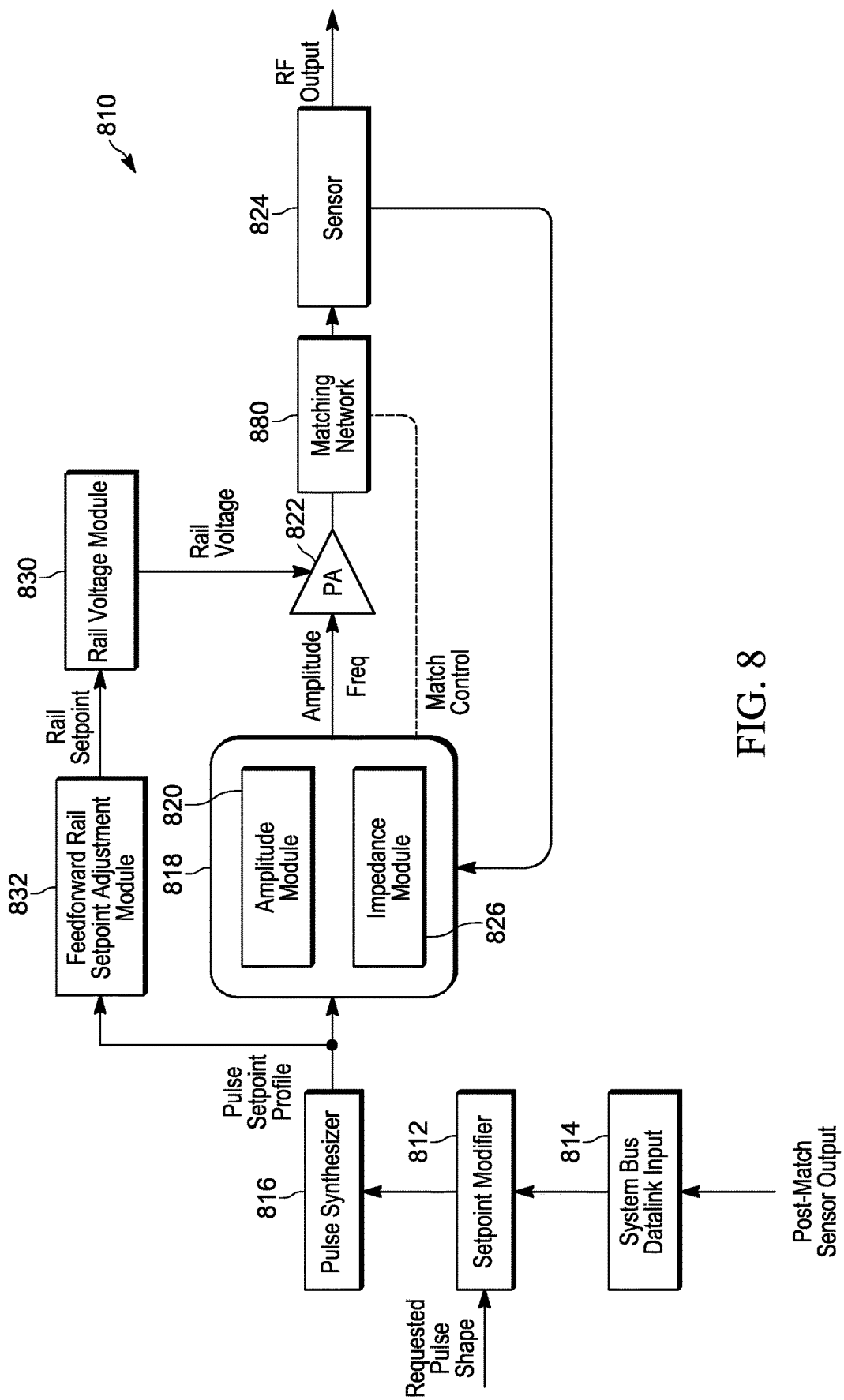
FIG. 8 shows a block diagram of a RF generation system using one or more of amplitude control, frequency control, matching network control, and feedforward rail voltage control arranged in accordance with the present disclosure.

FIG. 8 shows RF power generation system 810 which is similarly configured to RF power generation systems 610 of FIG. 6 and RF power generation system 710 of FIG. 7. The RF power generation system 810 of FIG. 8 further includes a feedforward rail setpoint adjustment module 832. Feedforward rail setpoint adjustment module 832 receives the at least a rail parameter of pulse setpoint profile from pulse synthesizer 816. Pulse synthesizer 816 also outputs the pulse setpoint profile to RF control module 818. Feedforward rail setpoint adjustment module 832 received the pulse setpoint profile from pulse synthesizer 816 and applies feedforward adjustments to the rail setpoint profile in order to generate the rail setpoint to rail voltage module 830. Thus, feedforward rail setpoint adjustment module 832 applies feedforward adjustments to the rail voltage portion of the pulse setpoint profile in order to vary the rail voltage applied to power amplifier 822. In various configurations, varying the rail voltage applied to power amplifier 822 provides improved responsiveness in order to limit or eliminate rail droop during long pulses.

Figure 9A:
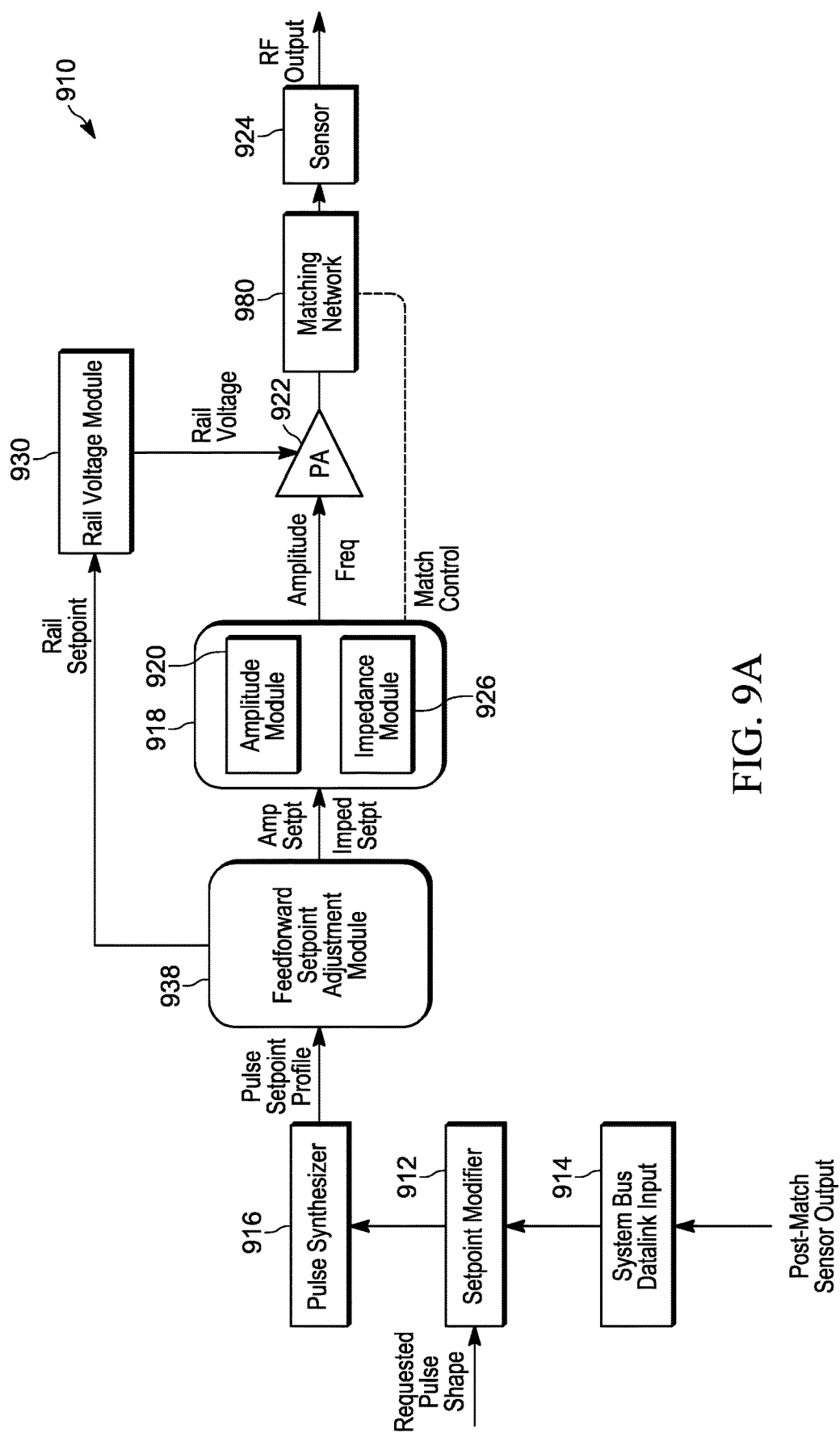
FIGS. 9A and 9B show block diagrams of RF power generation systems including feedforward adjustment of one or more of amplitude, frequency, matching network components, and rail voltage setpoint control.

FIG. 9A shows a RF power generation system 910 similarly configured to FIGS. 5-8, and further including a feedforward setpoint adjustment module 938. Feedforward setpoint adjustment module 938 receives the pulse setpoint profile from pulse synthesizer 916. In various configurations, the pulse setpoint profile can define one or more of at least a rail voltage, an amplitude, or an impedance to control power delivery from power amplifier 922 to the load. As shown in FIG. 9A, feedforward setpoint adjustment module 938 generates a feedforward adjusted rail setpoint input to rail voltage module 930, a feedforward adjusted amplitude setpoint input to control module 918, and a feedforward adjusted impedance setpoint input to RF control module 918. The impedance setpoint determines one or both of frequency for power amplifier 922 or settings for matching network 980. Generation of the feedforward setpoint adjustments will be described in further detail. In a high power RF generator system, multiple identical low power modules are combined to generate the output power. The controllers described can also enable/disable a subset of the power modules as an additional actuator for amplitude control.

In various configurations, feedforward setpoint adjustment module 938 can implement a Single Input Signal Output (SISO) or a Multiple Input Multiple Output (MIMO) approach for one or more of the output variables. In a non-limiting example of one configuration, feedforward setpoint adjustment module 938 may generate setpoint adjustments to the pulse setpoint profile to adjust one or more of amplitude, impedance using frequency or match network control, rail setpoint, or a number of power amplifier modules enabled or disabled using SISO or MIMO based control. In one non-limiting example, amplitude may be controlled using either SISO or MIMO, impedance may be controlled using either SISO or MIMO to control frequency or matching network components, and rail voltage could be controlled using either SISO or MIMO. In various configurations, rail voltage could be controlled independently. In various other configurations, SISO loops or MIMO loops can be used for a feedforward portion and/or a feedback portion of control for any of the output parameters, such as amplitude setpoint, impedance setpoint by controlling one or both of frequency or matching network components, and rail voltage setpoint. In a further non-limiting example, one control approach can use MIMO control for frequency, and SISO control, using multiple individual SISO control loops for rail voltage and amplitude setpoints for power amplifier 922.

Figure 9B:
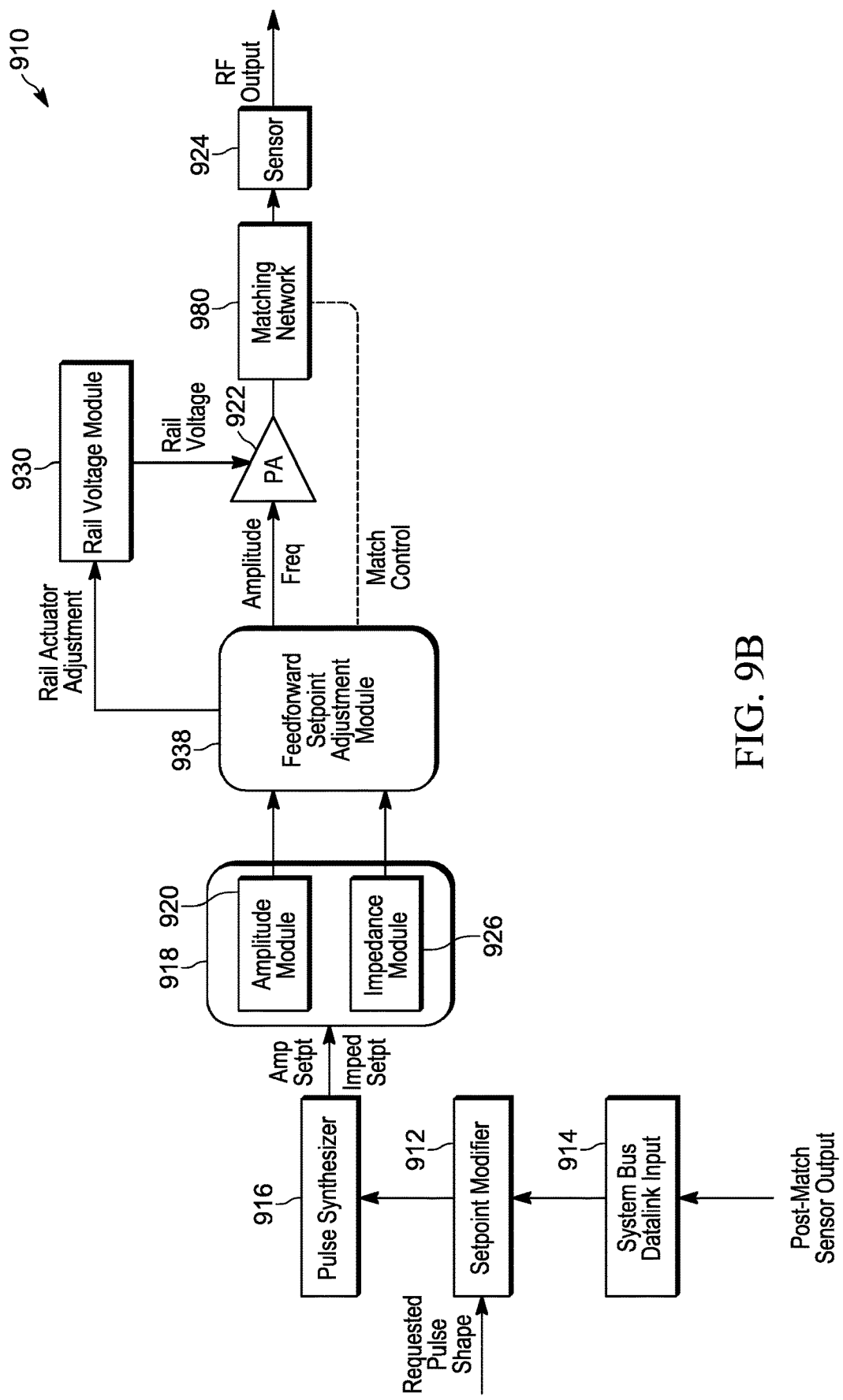

FIG. 9B shows a variation of the configuration of FIG. 9A. In FIG. 9B, the order of the control module 918 and feedforward setpoint adjustment module 938 have been changed so that the feedforward adjustment is applied to the respective amplitude, frequency, matching network components, and rail voltage module. Thus, rather than feedforward setpoint adjustment module 938 adjusting setpoint values as shown in FIG. 9A, the actuator or actuator values are adjusted in FIG. 9B using feedforward control.

Figure 10:
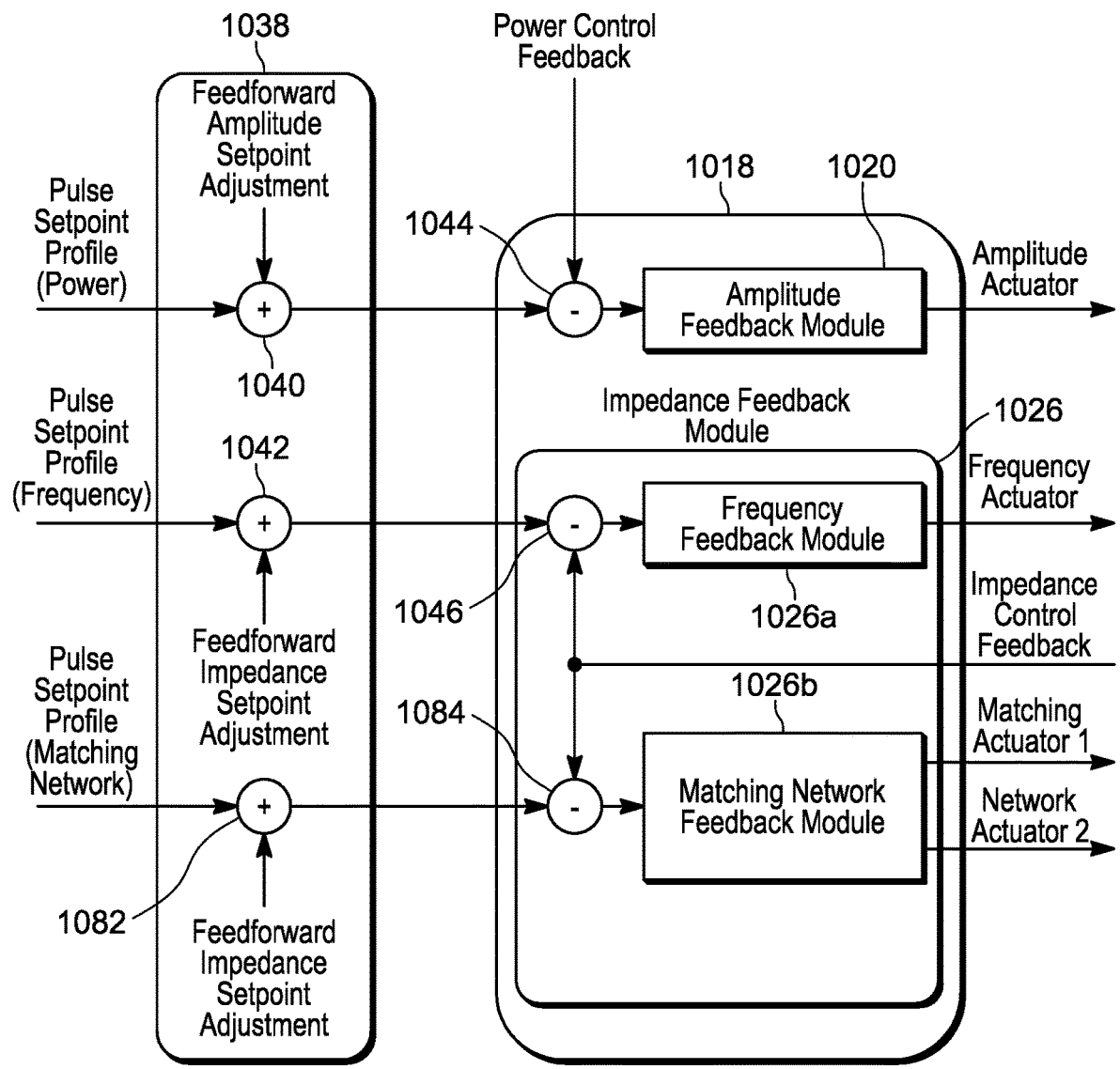
FIG. 10 shows a first approach to feedforward control using setpoint adjustment in accordance with the present disclosure.

FIG. 10 shows an expanded view of the feedforward setpoint adjustment module 938 and the RF control module 918 of FIG. 9A, referred to as feedforward setpoint adjustment module 1038 and RF control module 1018. Feedforward setpoint adjustment module 1038 receives a pulse setpoint profile component, such as for power applied to the load, input to combiner 1040. A feedforward setpoint adjustment for adjusting amplitude is also input to combiner 1040. Similarly, combiner 1042 receives a pulse setpoint profile component for controlling frequency for impedance control, such as the fundamental frequency of the RF signal applied to the load. Combiner 1042 also receives a feedforward setpoint adjustment for adjusting the frequency component of the pulse setpoint profile, as will be described herein. Similarly, combiner 1082 receives a pulse setpoint profile component, such as for controlling matching network components to control impedance. Combiner 1082 also receives a feedforward setpoint adjustment for adjusting the matching network components of the pulse setpoint profile, as will be described herein. Combiner 1040 combines the pulse setpoint profile component (for power) and the feedforward setpoint adjustment and outputs a signal to combiner 1044 of RF control module 1018. Similarly, combiner 1042 combines the pulse setpoint profile component (for frequency) the feedforward impedance setpoint adjustment for frequency and to output a combined signal to combiner 1046 of RF control module 1018. Similarly, combiner 1082 combines the pulse setpoint profile component (for matching network control) and the feedforward impedance setpoint adjustment for matching network control to output a combined signal to combiner 1084 of RF control module 1018.

Combiner 1044 determines the difference between the feedforward adjusted setpoint output by combiner 1040 and a power control feedback value. In various configurations, power control feedback power value may be forward power $P_{FWD}$, reverse power $P_{REV}$, or delivered power $P_{DEL}$. Combiner 1046 determines the difference between the adjusted feedforward setpoint output by combiner 1042 and a frequency control feedback measurement. Combiner 1084 determines the difference between the adjusted feedforward setpoint output by combiner 1084 and the frequency control feedback value. In various configurations, the impedance control feedback value may be determined based on reverse power $P_{REV}$, forward power $P_{FWD}$, delivered power $P_{DEL}$, or the reflection coefficient gamma (Γ).

Amplitude feedback module 1020 receives the difference signal output by combiner 1044 and generates an amplitude actuator signal to control an actuator of the power amplifier, such as the power amplifiers described above. Impedance feedback module 1026 may include one or both frequency feedback module 1026a and matching network feedback module 1026b. Frequency feedback module 1026 receives the difference signal output by combiner 1046 and generates a frequency actuator signal to control the frequency output by the power amplifiers described above. Similarly, matching network module 1026b receives the difference signal output by combiner 1084 and generates one or more matching network actuator signals to control components of the matching network described above. In various configurations, the feedforward setpoint adjustment of impedance feedback module 1026 are varied in order to minimize the reflection coefficient Γ or other feedback measurement values described above. Feedforward setpoint adjustment module 1038 adjusts setpoints to control the pulse shape setpoints. The frequency actuator signal generated by frequency feedback module 1026a and the matching network actuator signals generated on matching network feedback module 1026b cooperate to provide respective frequency tuning and matching network tuning in order to minimize the reflection coefficient or other impedance feedback measurement values described above.

Figure 11:
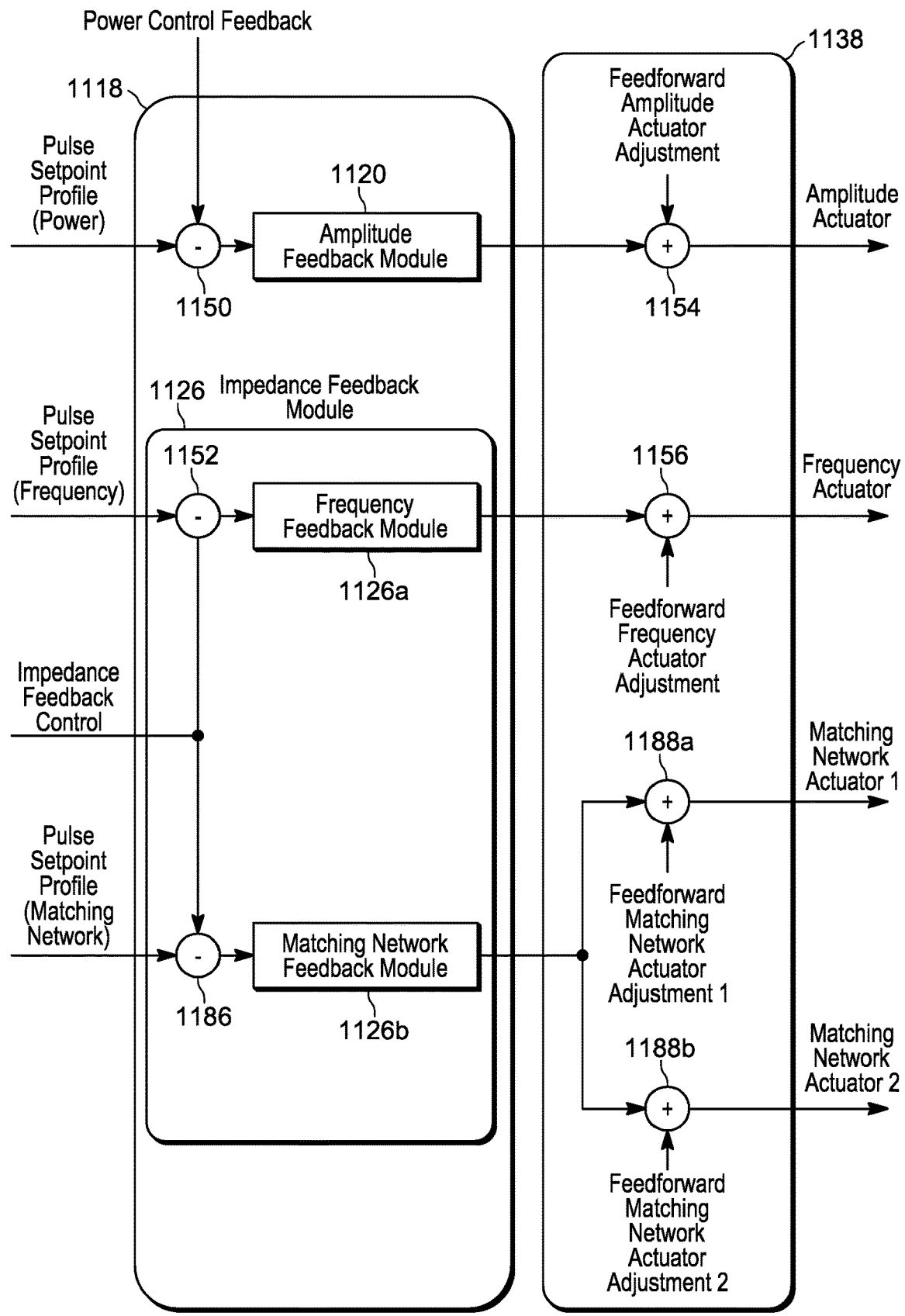
FIG. 11 shows a second approach feedforward control using actuator adjustment in accordance with the present disclosure.

FIG. 11 depicts control modules similar to FIG. 10, with the control modules in FIG. 11 arranged in opposite order so that RF control module 1118 generates control signals which are then adjusted by feedforward actuator adjustment module 1138. FIG. 11 shows an expanded view of the RF control module 918 and the feedforward setpoint adjustment module 938 of FIG. 9B. In FIG. 10, the feedforward adjustment occurs before generation of the actuation signals, whereas in FIG. 11, feedforward adjustments are applied to the actuator signals. It should be noted that the configuration of FIG. 10 or FIG. 11 can be implemented in the various RF power generation systems described here in accordance with particular design choices.

In FIG. 11, a pulse setpoint profile component for power is input to combiner 1150 along with a power feedback control value or signal, such as forward power $P_{FWD}$, reverse power $P_{REV}$, or delivered power $P_{DEL}$. Combiner 1150 determines a difference between the pulse setpoint profile component for power and the power control feedback signal to generate an error signal input to amplitude feedback module 1120. A pulse setpoint profile component for controlling frequency for impedance control is input to combiner 1152 along with an impedance feedback control value or signal, such as based on the measurement values described above which vary in accordance with the effect of frequency on impedance, to combiner 1152. Combiner 1152 determines a difference between the pulse setpoint profile for controlling frequency to control the impedance and the impedance feedback control value or signal to generate an error signal input to frequency feedback module 1126a. Combiner 1186 determines a difference between the pulse setpoint profile for controlling components of the matching network to control the impedance and the impedance feedback control value or signal based on the measurement values described above to generate an error signal input to matching network feedback module 1126b. Amplitude feedback module 1120 outputs a control signal for controlling the amplitude of power amplifier output, such as power amplifier of FIG. 1. Frequency feedback module 1126a outputs a frequency control signal to vary the frequency of the RF signal output by the RF power amplifier. Matching network feedback module 1126b outputs one or more control signals to vary one or more components of the matching network.

The control signals are input to feedforward actuator adjustment module 1138. Feedforward actuator adjustment module 1138 includes a first combiner 1154 that combines a feedforward amplitude actuator adjustment with the actuator signal output by amplitude feedback module 1120. Combiner 1156 combines a feedforward frequency actuator adjustment with the actuator signal output from feedback frequency module 1126. Respective combiners 1188a, 1188b combine the respective feedforward matching network actuator adjustment 1 and matching network actuator adjustment 2 with the actuator signal output from frequency feedback module 1126a. Combiner 1154 thus outputs an amplitude actuator signal to the power amplifier, combiner 1156 outputs a frequency actuator signal to the power amplifier, combiner 1088*a* outputs a first matching network actuator signal to the matching network, and combiner 1088*b* outputs a second matching network actuator signal to the matching network.

In the RF power generation systems described herein, the signal from the post-match sensor, such as sensors 166*a*, 166*b*, could be provided by an analog or a digital link or digital communications link, such as a System Bus Datalink, or other datalink, such as an Ethernet Industrial Bus, including Transmission Control Protocol (TCP) or User Datalink Protocol UDP), a fiber optic, or a gigabit transceiver datalink connection or the like. In various configurations, instantaneous data transfer from the post-match sensor is typically not necessary because the data is synchronized to the pulse and stored prior to transmitting from the post-match sensor to the RF generator. This approach is particularly effective where the shape of the pulses is consistent over relatively short time periods relative to the pulse width. Adjustments made to the pulse shape actuations by the generator utilize pulse shape data received from the post-match sensor to facilitate adjustment of future pulse states in order to improve the pulse shape over time. Conventional communication of sensed RF signal parameters is employed in an analog approach offers limited effectiveness for controlling pulse shape based on the measured data. However, using a digitally communicated sensor signal and given the periodic, repetitive nature of pulse data to be measured at the post-match sensor provides improved signal-to-noise ratios that makes post-match sensor using effective for sensing pulse parameters, such as the parameters described above for pulse shape control.

Figure 12:
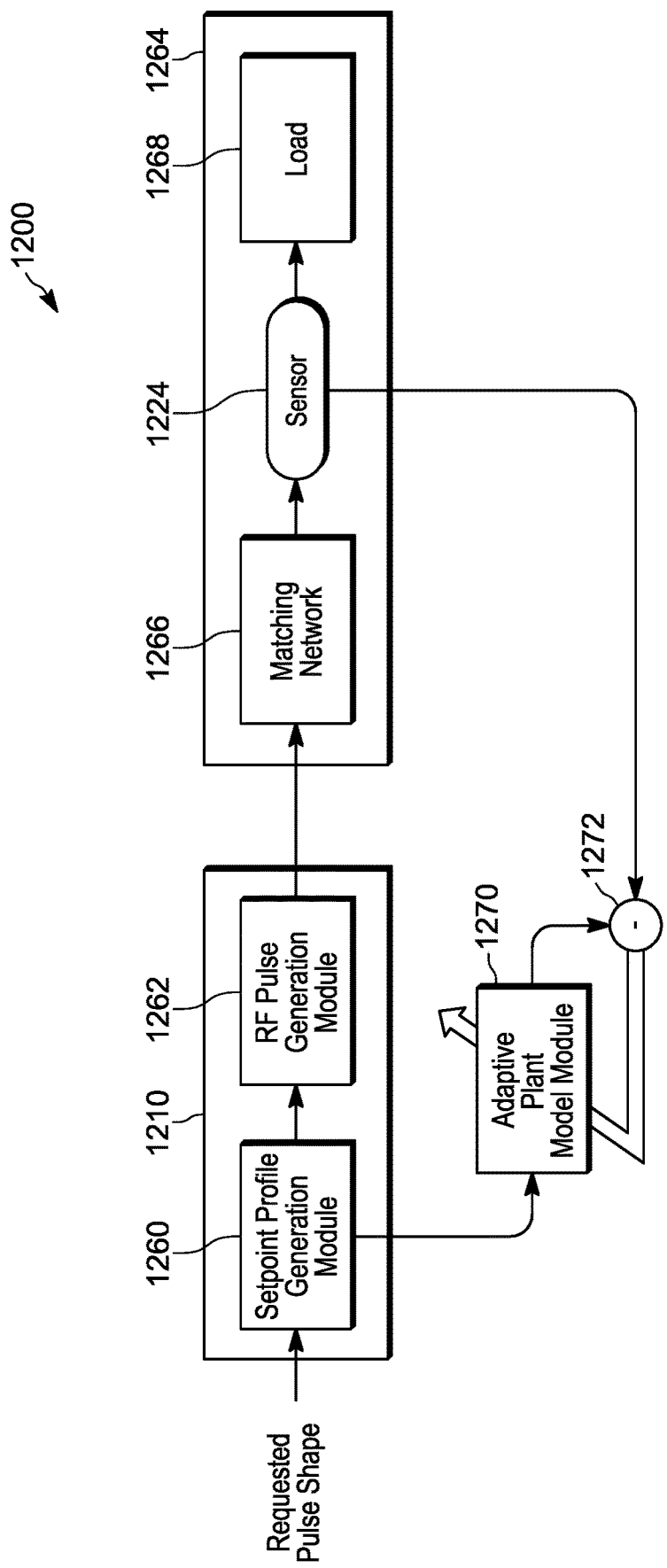
FIG. 12 shows a RF generation system in which an adaptive plant model is used to generate feedforward parameters.

With reference to FIGS. 12-15, various approaches may be used to improve and maintain pulse shapes over time. In various configurations, an adaptive modeling approach, such as shown in FIG. 12 can be used to estimate the dynamics of the pulse between the commanded or requested pulse shape and the pulse shape measured by the post-match sensor at the input to the load. The adaptive model defines a plant model that can be used to determine pulse parameters for both feedforward and feedback controllers to assist in tailoring pulse shapes for the present operating conditions. The pulse parameters can include pulse amplitude, pulse duration, rail voltage, and impedance (frequency and matching network control). For the RF generation systems described in FIGS. 12-15, the model is constructed from the setpoint profile generation to the post-match sensor, in proximity to the reactor or the load, to improve the model.

With reference to RF pulse shaping system 1200 of FIG. 12, RF pulse shaping system 1200 receives a requested pulse shape input to RF power generation system 1210. RF power generation system 1210 includes setpoint profile generation module 1260 and RF pulse generation module 1262. RF power generation system 1210 outputs a pulsed RF signal to output network 1264, which includes matching network 1266 and a post-match sensor 1224 providing output power to load 1268. RF pulse shaping system 1200 also includes adaptive plant model 1270, also referred to as a learned plant model, which generates feedforward coefficients to RF power generation system 1210.

Adaptive plant model 1270 receives a pulse setpoint profile defining the profile of a pulse output by setpoint profile generation module 1260 and constructs an expected, modeled pulse shape to be measured by sensor 1224. The modeled pulse shape is compared with the measured pulse shape output from sensor 1224. Thus, adaptive plant model 1270 acts as a transfer function that operates on the pulse setpoint profile received from setpoint profile generation module 1260. The difference between the output of adaptive plant model 1270 and measured pulse shape output by sensor 1224 is determined by combiner 1272 which determines the difference between the output of the adaptive plant model 1270 and the measured pulse shape output by sensor 1224. The difference output by combiner 1272 is input to adaptive plant model 1270 which adjusts the model in accordance with the difference. Adaptive plant model 1270 outputs adjustment coefficients, or other plant model descriptions, to RF power generation system 1210. RF power generation system 1210 includes, individually or cooperatively between setpoint profile generation module 1260 and RF pulse generation module 1262, a feedforward setpoint adjustment controller as described above with respect to FIGS. 8-11.

Figure 13:
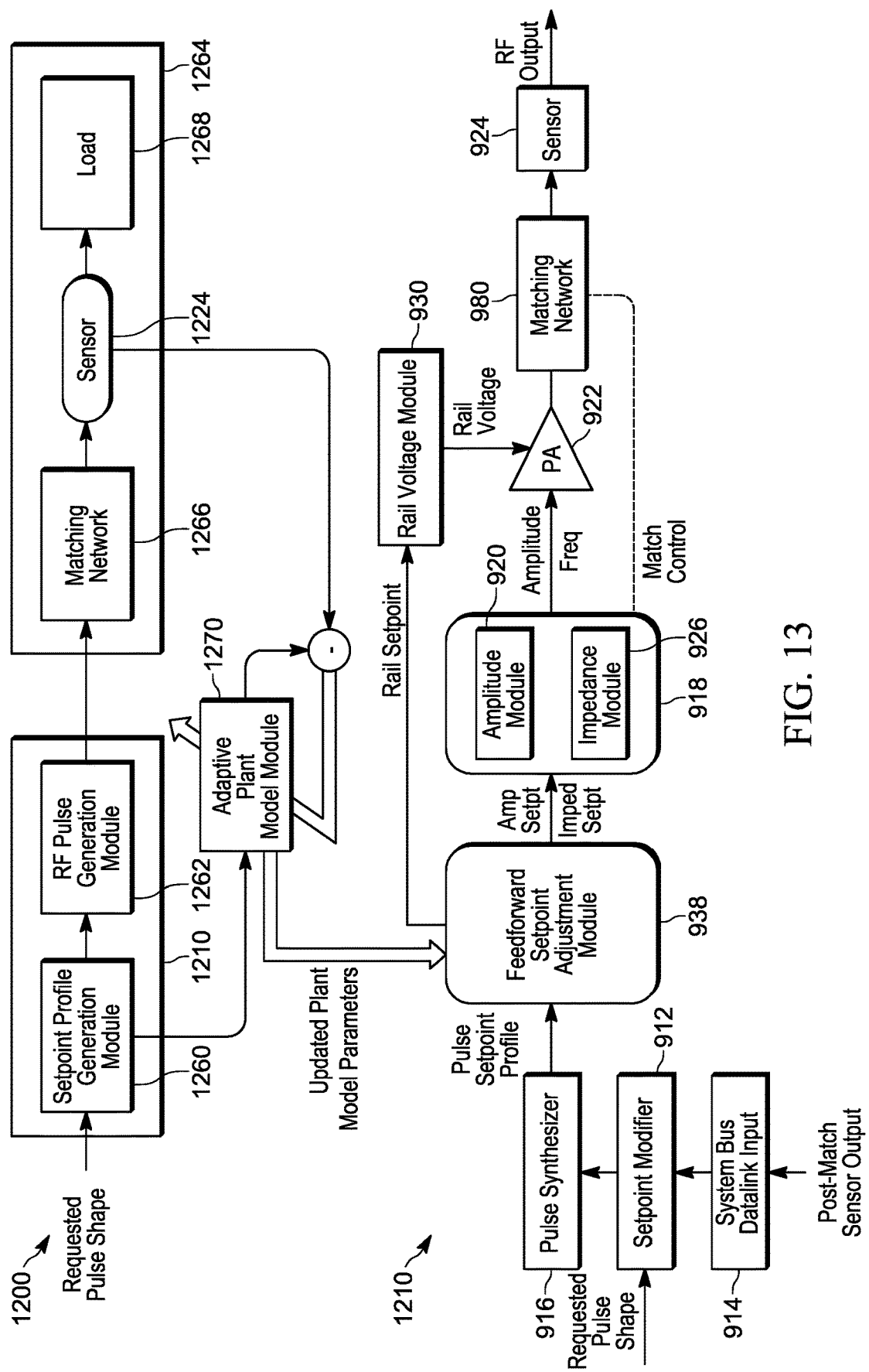
FIG. 13 shows a RF generation system in which an adaptive plant model is used to adjust feedforward parameters and showing interaction of the adaptive plant model with the feedforward setpoint adjustment module.

FIG. 13 depicts components of FIGS. 9A and 12 showing the interaction between adaptive plant model 1270 and feedforward setpoint adjustment module 938. As can be seen in FIG. 13, feedforward adjustment plant model parameters output by adaptive plant model 1270 are input to feedforward setpoint adjustment module 938. The feedforward adjustment values can be applied as shown in FIGS. 8-11, by way of non-limiting example. As can also be seen in FIG. 8-11, RF power generation system 1210 is substantially implemented using the components of FIG. 9. It should be noted in FIG. 13 that sensor 924 is positioned at the output of the power amplifier and is a pre-match sensor, while sensor 1224 is configured as a post-match sensor, similar to sensors 166A, 166B of FIG. 1.

With further reference to FIGS. 12 and 13, plant model of 1270 may be estimated during a learning phase until sufficient data is accumulated to accurately model the plant. Further, as can be seen in FIGS. 12 and 13, the adaptive plant model can be used to determine feedforward adjustments during an operational phase. The learning phase may overlap with the operational phase so that feedforward adjustments may be updated during operation through a learning process. During such overlap, the rate at which the plant model parameters output by adaptive plant model 1270 are input to feedforward setpoint adjustment module 938 may be substantially slower than the pulse repetition period. Further, as described above, the learned plant model may include SISO and MIMO models and controllers. In various configurations, each of the rail setpoint, amplitude setpoint, and frequency setpoint can be adjusted using separate SISO or MIMO controllers.

Figure 14:
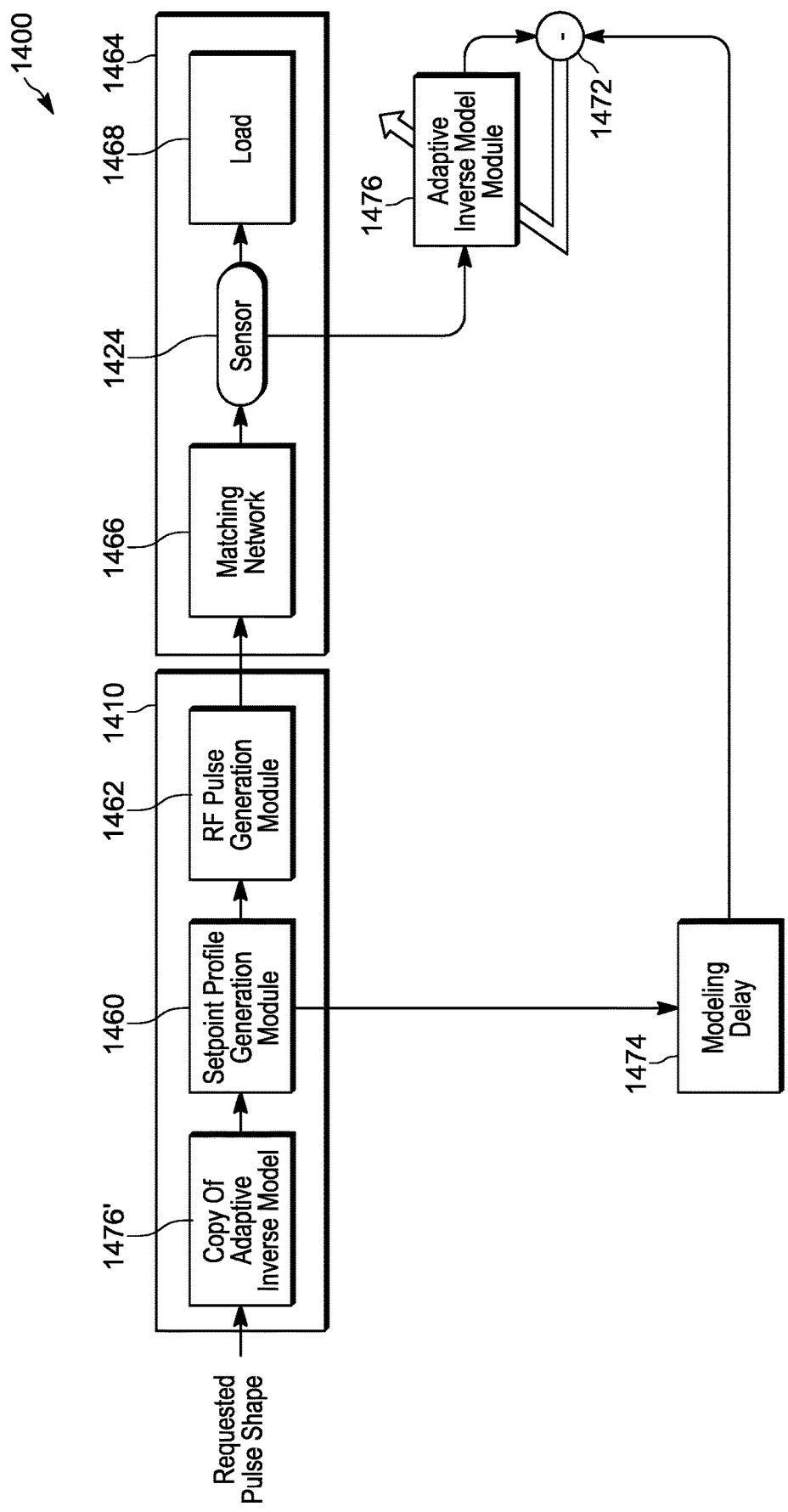
FIG. 14 shows a RF generation system in which an adaptive inverse model is used to generate feedforward adjustment parameters.

FIG. 14 shows a RF pulse shaping system 1400 arranged similarly to FIG. 12. While RF pulse shaping system 1200 describes an adaptive plant model, RF pulse shaping system 1400 shows an adaptive inverse model. Adaptive inverse model is shown at 1476, and a copy of adaptive inverse model 1476' is included in RF generator 1410. Adaptive inverse model 1476 models an inverse of the plant so that the application of the adaptive inverse model to the requested pulse shape cancels out the effect of the plant so that the requested pulse shape input to RF generator 1410 represent the pulse shape applied to load 1468.

Setpoint profile generation module 1460 outputs the determined setpoint profile to combiner 1472. The setpoint profile output by setpoint profile generation module 1470 passes thru a modeling delay 1474 in order to synchronize the comparison of the setpoint profile output by setpoint profile generation module 1460 with the inverse modeled pulse shape output by adaptive inverse model module 1476. Adaptive inverse model module 1476 receives the pulse shape measured by sensor 1424 and applies an inverse plant transfer function to output an inverse pulse setpoint profile. Combiner 1472 compares the output of adaptive inverse model module 1476 with the output of modeling delay 1474. Combiner 1472 determines the difference between the output of the adaptive inverse model module 1476 and the output of the setpoint profile generation module 1460. Thus combiner 1472 compares a delayed version of the pulse profile generated by profile generation module 1460 with the pulse profile generated by inverse model module 1476 when using as its input the signal measured by sensor 1424. The difference is input to adaptive inverse model module 1476, and adaptive inverse model module 1476 adjusts the inverse model to improve accuracy. Adaptive inverse model 1476 can be copied into RF generator 1410.

Figure 15:
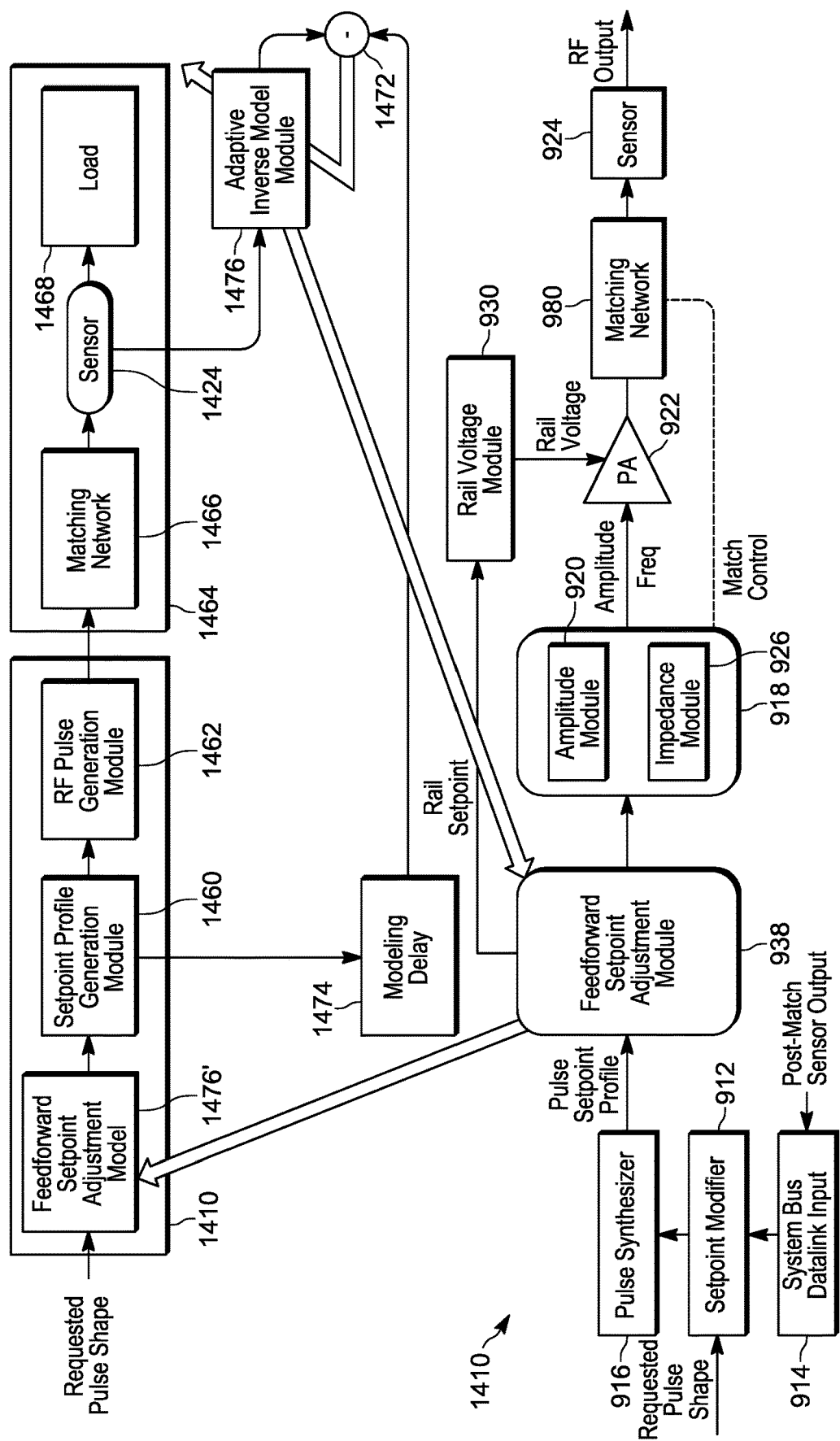
FIG. 15 is a block diagram of a RF generation system in which an adaptive inverse plant model is used to adjust feedforward parameters and showing interaction of the adaptive inverse plant model with the feedforward setpoint adjustments.

Similarly to FIG. 13, FIG. 15 shows a structural relationship between the RF pulse shaping system 1400 of FIG. 14 and RF power generation system 910 of FIG. 9. The adaptive inverse model generated by adaptive inverse model module 1476 generates coefficients input to feedforward setpoint adjustment module 938. Feedforward setpoint adjustment module 938 generates components which correspond to the copy of adaptive inverse model 1476'. Thus, adaptive inverse model module 1476 determines coefficients to implement the copy of adaptive model 1476'.

In various aspects, as described above with FIGS. 13-15, multiple approaches exist to maintain the shape of the pulses, including adaptive modeling and adaptive inverse modeling. Adaptive modeling estimates the dynamics of the pulse response from the setpoint to the post-match measurement. The plant model can then be used to determine the pulse parameters for both feedforward and feedback controllers to assist in tailoring the pulse shapes to the current operating conditions. FIGS. 12 and 13 show an example of an adaptive modeling approach. One benefit of the adaptive modeling approach is that the model is constructed to the post-match sensor location, typically in close proximity to the load or plasma chamber.

In an alternative configuration, an adaptive inverse model approach, such as shown in FIGS. 14 and 15, enables maintaining the shape of the pulse. In the inverse adaptive modeling approach, the setpoint profile is adjusted in advance to enable the desired user pulse shape to propagate to the post-match position following transformation starting from the inverse to the requested pulse shape. The learned model is thus an estimate of the inverse of the plant dynamics so that when the desired pulse shape is adjusted in accordance with the copy of the adaptive inverse model, the pulse obtains its desired shape at the input to the reactor as the plant applies the opposite effect of the inverse model.

In various configurations, an iterative learning control (ILC) can be used to learn the setpoint trajectory adjustments required to achieve the post-match pulse shapes. One variant of the ILC approach leverages an adaptive plant model, which in state-space form consists of A, B, and C matrices. The plant model output $y_j(k)$ can be written as Equation (1) shown below:

$$y_j(k) = C(qI-A)^{-1}Bu_j(k) \quad (1)$$

Where:
C is matrix that defines how the outputs couple to the plant;
q is a forward time shift operator;
I is an identity matrix;
A is a matrix defining the dynamic response of the plant;
B is a matrix defining how the inputs couple to the plant; and $u_j(k)$ is the value of the $k^{th}$ discrete sample (time index) within a pulse profile of a $j^{th}$ pulse iteration.

Using standard techniques, the plant model can then be used to determine the parameters of Q and L filters to enable fast, stable convergence of the ILC controller to desired pulse profile. The Q and L filters are shown in the following Equation (2).

$$u_{j+1}(k) = Q(q)[u_j(k) + L(q)e_j(k+1)] \quad (2)$$

Where:
Q and L are filters;
q, j, and k are as described above with respect to Equation (1); and
e is the error for the feedback control loop.

Thus $u_{j+1}(k)$ determines one or more feedforward adjustments for one or more pulse parameters of a pulse setpoint profile.

In an adaptive inverse plant model approach, as shown in FIGS. 14 and 15, the inverse plant model can be used to construct an ILC update rule to update the feedforward adjustment as shown in Equation (3)

$$u_{j+1}(k) = u_j(k) + \hat{P}^{-1}e_j(k) \quad (3)$$

Where:
$\hat{P}^{-1}$ is the inverse plant model; and
u, j, k, and e are as described above with respect to Equations (1) and (2), above.

The estimated inverse plant model of Equation (3) is used to determine the next controller actuator values based on the current actuations and current errors. Thus, similarly to $u_{j+1}(k)$ of Equation (2) above, $u_{j+1}(k)$ of Equation (3) determines one or more feedforward adjustments for one or more pulse parameters of a pulse setpoint profile. Equation (3) describes feedforward adjustment for each actuator in a SISO control approach. In a MIMO control approach, Equation (3) may be implemented in a matrix that describes control of multiple actuators in response to multiple inputs. In various control approaches, a matrix equation describing MIMO may also describe multiple single loop SISO as a specialized case.

In various other configurations, a further variant of an ILC approach involves an extremum-seeking control (ESC) method. In the ESC approach, the actuator profile or the reference trajectory, or both, are split into a predetermined number of bins. At each pulse iteration, the current profile of setpoints/actuations is applied and the error is measured. The local gradient of the pulse shape error with respect to these bins/setpoints/actuations is then estimated and is used to determine the direction to move the bin values in order to reduce the overall pulse shape error. In a variation, in order to reduce complexity of the setpoint/actuation profile, various approaches, such as using linear splines with a minimal number of knot-points can also be used, or other basis function sets, such as Fourier basis or Legendre polynomial basis, can be used, where the actuator profile is determined by scaling individual basis functions. An example of an ESC approach can be found with reference to U.S. patent application Ser. No. 17/102,598, assigned to the Assignee of the present application and incorporated by reference in this application.

Figure 16:
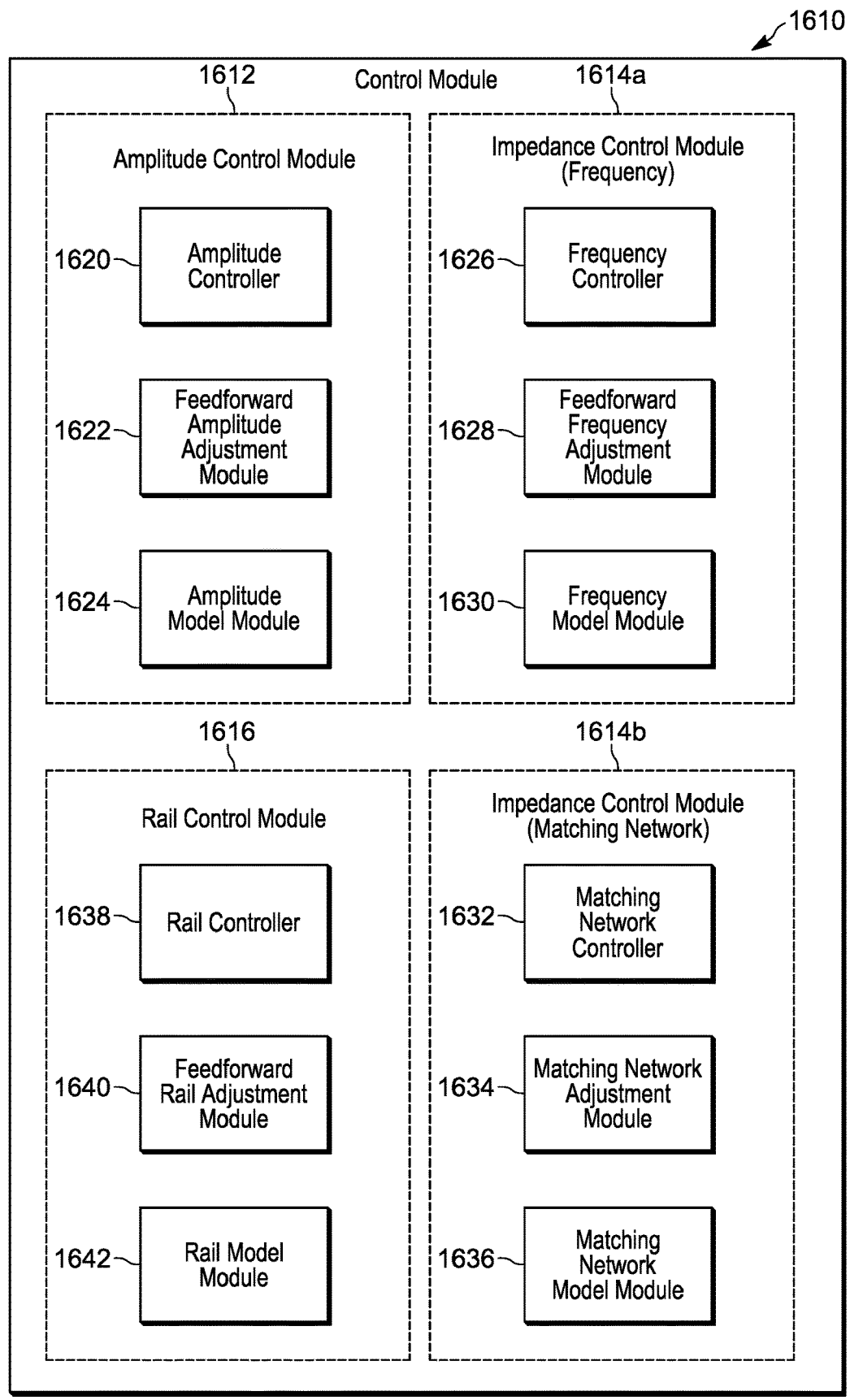
FIG. 16 shows a functional block diagram of an example control module arranged in accordance with various embodiments.

FIG. 16 incorporates various components of the prior figures. Control module 1610 may include amplitude control module section 1612, frequency control module section 1614a for impedance control, a matching network control module section for impedance control 1614b, and rail control module section 1616. Amplitude control module section 1612 includes amplitude controller 1620, feedforward amplitude adjustment module 1622, and amplitude model module 1624. Impedance control module section 1614*a* includes frequency controller 1626, feedforward frequency adjustment module 1628, frequency model module 1630. Impedance control module section 1614*b* includes matching network controller 1632, matching network adjustment module 1634, and matching network module 1636. Rail control module section 1616 includes rail controller 1638, feedforward rail adjustment module 1640, and rail model module 1642. In various embodiments, control module 1610 includes one or a plurality of processors, controllers, modules, or submodules that execute code associated with the module sections or modules 1610, 1612, 1614*a*, 1614*b*, 1616, 1618, 1620, 1622, 1624, 1626, 1630, 1632, 1634, 1636, 1638, 1640, and 1642. Operation of the module sections or modules 1610, 1612, 1614*a*, 1614*b*, 1616, 1618, 1620, 1622, 1624, 1626, 1630, 1632, 1634, 1636, 1638, 1640, and 1642 is described below with respect to the method of FIG. 17.

For further defined structure of control modules 120*a*, 120*b*, 120' of FIG. 1 and the controllers and modules described herein, see the below provided flow chart of FIG. 17 and the below provided definition for the term "module". The systems disclosed herein may be operated using numerous methods, examples, and various control system methods of which are illustrated in the figures. Although the following operations are primarily described with respect to the implementations of the figures, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 17:
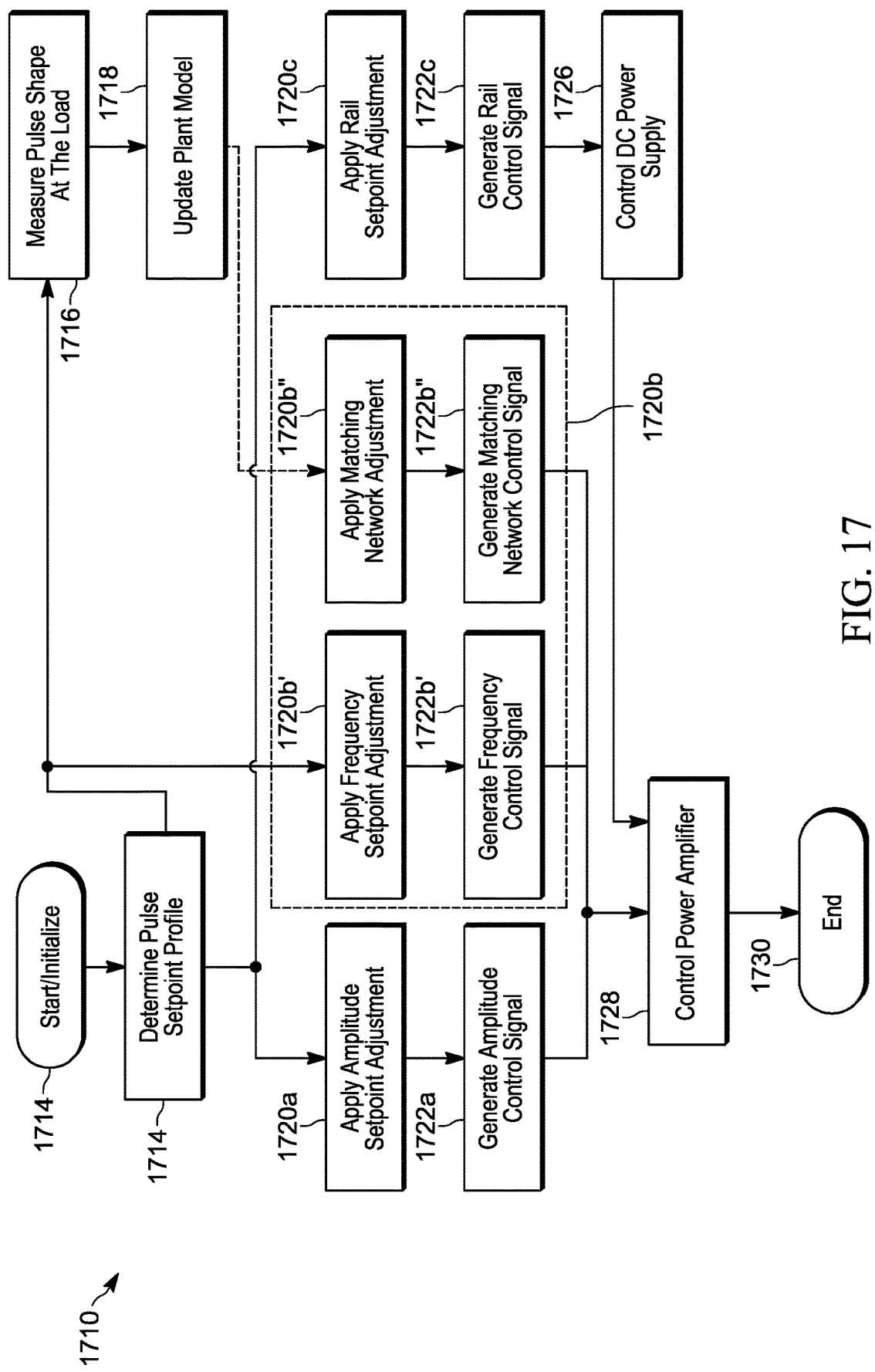
FIG. 17 shows a flow chart of operation of a control system arranged in accordance with the principals of the present disclosure.

FIG. 17 shows a flow chart of a control system 1710 for performing pulse shaping control for, for example, the power delivery systems of FIG. 1. Control begins at block 1712 and proceeds to block 1714. Block 1714 determines a pulse setpoint profile based on a request pulse profile or shape. Block 1714 outputs the setpoint profile to setpoint adjustment blocks 1720*a*, 1720*b* (1720*b'*, 1720*b''*), 1720*c*. Block 1714 also outputs the pulse setpoint profile to block 1716. Block 1716 and block 1718 cooperate to determine the pulse shape at the load at block 1716, and compare the pulse shape at the load with the requested pulse shape in order to update the plant model at block 1718.

The output from block 1714, which is the pulse setpoint profile, and the output of block 1718, which are coefficients based on the plant model, are output to respective setpoint adjustment blocks 1720*a*, 1720*b* (1720*b'*, 1720*b''*), 1720*c*. Setpoint adjustment block 1720*a* determines applies amplitude setpoint adjustments in order to achieve the desired pulse shape by modifying the amplitude of the signal output by the power amplifier in order to generate the desired pulse shape. Control then proceeds to block 1722*a* which generates an amplitude control signal in accordance with the adjustments applied to the pulse setpoint profile at block 1720*a*. The amplitude control signal output at block 1722*a* is input to block 1728 to control the power amplifier.

Similarly, block 1720*b'* applies impedance setpoint adjustments for frequency control of impedance in order to achieve the desired pulse shape by modifying the frequency of the signal output by the power amplifier in order to generate the desired pulse shape. Control then proceeds to block 1722*b'* which generates a frequency control signal in accordance with the adjustments applied to the pulse setpoint profile output from block 1720*a*. The frequency control signal output at block 1722*b'* is input to block 1728 to control the power amplifier.

Similarly, block 1720*b''* applies matching network component setpoint adjustments in order to adjust control of the matching network components and thereby control power delivered to the load. Control then proceeds to block 1722*b''* which generates one or more matching network component control signals in accordance with the setpoint adjustments applied to at block 1720*a*. The one or more matching network component control signals output at block 1722*b''* are input to block 1728 to control the matching network.

Block 1720*c* applies rail voltage setpoint adjustments in order to achieve the desired pulse shape by modifying the rail voltage applied to the power amplifier in order to generate the desired pulse shape. Control proceeds to block 1722*c* which generates a rail voltage control signal in accordance with the adjustments applied to the pulse setpoint profile output from block 1720*c*. The rail voltage control signal controls a DC power supply as shown at block 1726, and the DC power supply outputs a rail voltage to control the power amplifier as shown at block 1728. The process terminates at block 1730.

It should be understood that while FIG. 17 is directed to setpoint adjustment, actuator adjustment can be implemented similarly as shown in FIG. 17. Further, any combination of setpoint and actuator control can be implemented for each of the power, impedance, and rail voltage parameters to be controlled.

By controlling pulse shape based on parameters measured by a post-match sensor, the RF pulse shaping system described herein automatically adjusts RF pulse characteristics at the load, which is the closes measurement position to the reaction in a plasma chamber. The approach described herein facilitates load-to-load, or chamber-to-chamber, matching. A post-match sensor is positioned downstream and is unaffected by affects introduced by the matching network as the matching network adjusts to changing system impedances, such as impedance changes occurring at the load or plasma chamber. The present disclosure facilitates narrower pulse shapes over conventional pulse shaping approaches. Narrow pulse shapes create process space for device geometries with higher aspect ratios or processes that require higher etch selectivity.

Conclusion

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be used interchangeably and may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WWI wireless networking standard) and IEEE Standard 802.3-2015 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, ObjectiveC, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A RF generator comprising:
   a RF power source; and
   a RF control module coupled to the RF power source and configured to generate at least one control signal to vary a respective at least one of an RF output signal from the RF power source or an impedance between the RF power source and a load, wherein the RF output signal includes a RF signal modulated by a pulse signal, and the RF control module is further configured to adjust the at least one control signal to vary at least one of an amplitude or a frequency of the RF output signal or the impedance between the RF power source and the load to control a shape of the pulse signal,
   wherein at least one of the amplitude, the frequency, or the impedance is adjusted in accordance with respective amplitude, frequency, and impedance feedforward adjustments and respective amplitude, frequency, and impedance and feedback adjustments that vary in accordance with a respective sensed pulse parameter detected between a matching network and the load.

2. The RF generator of claim 1, wherein the respective feedforward adjustments vary the at least one of the amplitude, frequency, or impedance in accordance with one of forward power, reverse power, delivered power, or a reflection coefficient.

3. The RF generator of claim 2, wherein the amplitude of the RF signal varies in accordance with at least one of an amplitude of the at least one control signal or an amplitude of a rail voltage applied to the RF power source.

4. The RF generator of claim 3, wherein the respective feedforward adjustments vary at least one of the amplitude of the at least one control signal or the amplitude of the rail voltage applied to the RF power source.

5. The RF generator of claim 1, wherein the respective feedforward adjustments adjust at least one of a setpoint or an actuator.

6. The RF generator of claim 1, wherein the RF control module is further configured to further adjust the at least one of the amplitude, the frequency, or the impedance in accordance with a RF parameter sensed between the RF power source and the load, wherein the at least one of the amplitude, the frequency, or the impedance are further adjusted in accordance with a respective feedback signal that varies in accordance with the RF parameter.

7. The RF generator of claim 1 further comprising a setpoint modifier configured to receive a requested pulse shape including a pulse setpoint parameter and to receive the respective sensed pulse parameter and adjusting the pulse setpoint parameter in accordance with the respective sensed pulse parameter to output an adjusted pulse shape.

8. The RF generator of claim 7 further comprising a pulse synthesizer configured to receive the adjusted pulse shape and output a pulse setpoint profile in accordance with the adjusted pulse shape, the pulse setpoint profile including a RF parameter setpoint for controlling the RF power source.

9. The RF generator of claim 8, wherein the at least one control signal varies in accordance with the RF parameter setpoint for controlling the RF power source.

10. The RF generator of claim 9, wherein the amplitude of the RF signal varies in accordance with at least one of an amplitude of the at least one control signal or an amplitude of a rail voltage applied to the RF power source.

11. The RF generator of claim 10, wherein the respective feedforward adjustments vary at least one of the amplitude of the at least one control signal or the amplitude of the rail voltage applied to the RF power source.

12. The RF generator of claim 11 wherein the RF control module is further configured to further adjust the at least one of the amplitude, the frequency, or the impedance in accordance with a RF parameter sensed between the RF power source and the load, wherein the amplitude, the frequency, or the impedance is adjusted in accordance with a respective feedback signal that varies in accordance with the RF parameter.

13. The RF generator of claim 1 wherein the respective sensed pulse parameter is communicated between a post-match sensor and the RF control module using a digital communication link.

14. The RF generator of claim 13 wherein the digital communication link includes at least one of a System Bus Datalink, an Ethernet Industrial Bus, a Transmission Control Protocol (TCP), a User Datalink Protocol (UDP), a fiber optic link, or a gigabit transceiver datalink.

15. The RF generator of claim 1, wherein the respective feedforward adjustments are determined in accordance with parameters generated by one of a plant model or an inverse plant model that describes a variation of the pulse signal as it propagates from the RF generator to the load.

16. A non-transitory computer-readable medium storing instructions, the instructions comprising:
   generating a RF output signal to a load;

generating at least one control signal to vary the RF output signal or an impedance between a RF power source and the load, wherein the RF output signal includes a RF signal modulated by a pulse signal;

adjusting the at least one control signal to vary at least one of an amplitude or a frequency of the RF output signal or the impedance between the RF power source and the load to control a shape of the pulse signal; and adjusting at least one of the amplitude, the frequency, or the impedance in accordance with respective amplitude, frequency, and impedance feedforward adjustments and respective amplitude, frequency, and impedance feedback adjustments that vary in accordance with a respective pulse parameter sensed between a matching network and the load.

17. The non-transitory computer-readable medium of claim 16 wherein the respective feedforward adjustments vary at least one of the amplitude, the frequency, or the impedance in accordance with one of forward power, reverse, power, delivered power, reflected power, or a reflection coefficient.

18. The non-transitory computer-readable medium of claim 17, wherein the amplitude of the RF signal varies in accordance with at least one of an amplitude of the at least one control signal or an amplitude of a rail voltage applied the RF power source.

19. The non-transitory computer-readable medium of claim 18, wherein the respective feedforward adjustments vary at least one of the amplitude of the at least one control signal or the amplitude of the rail voltage applied to the RF power source.

20. The non-transitory computer-readable medium of claim 19, the instructions further comprising adjusting the at least one of amplitude, frequency, or impedance in accordance with a RF signal parameter sensed between the RF power source and the load, wherein at least one of the amplitude, the frequency, or the impedance of the RF signal are further adjusted in accordance with a respective feedback signal that varies in accordance with a RF parameter sensed between the matching network and the load.

21. The non-transitory computer-readable medium of claim 16, wherein the respective feedforward adjustments adjust at least one of a setpoint or an actuator.

22. The non-transitory computer-readable medium of claim 16 the instructions further comprising receiving a requested pulse shape including at least one pulse setpoint parameter, receiving the respective pulse parameter, and adjusting the at least one pulse setpoint parameter in accordance with the respective pulse parameter to output an adjusted pulse shape.

23. The non-transitory computer-readable medium of claim 22 the instructions further comprising receiving the adjusted pulse shape and outputting a pulse setpoint profile in accordance with the adjusted pulse shape, the pulse setpoint profile including a RF parameter setpoint for controlling the RF power source.

24. The non-transitory computer-readable medium of claim 23, wherein the at least one control signal varies in accordance with the RF parameter setpoint for controlling the RF power source.

25. The non-transitory computer-readable medium of claim 24 wherein the amplitude of the RF signal varies in accordance with at least one of an amplitude of the at least one control signal or an amplitude of a rail voltage applied to the RF power source, and wherein the respective feedforward adjustments vary at least one of the amplitude of the at least one control signal or the amplitude of the rail voltage applied to the RF power source.

26. The non-transitory computer-readable medium of claim 25 the instructions further comprising adjusting at least one of the amplitude, the frequency, or the impedance in accordance with a RF signal parameter sensed between the RF power source and the load, wherein the amplitude, the frequency, or the impedance is adjusted in accordance with a feedback signal that varies in accordance with a RF parameter sensed between the matching network and the load.

27. The non-transitory computer-readable medium of claim 16, the instructions further comprising communicating the respective pulse parameter sensed between the matching network and the load between a post-match sensor and a RF control module using a digital communication link.

28. The non-transitory computer-readable medium of claim 27, wherein the digital communication link includes at least one of a System Bus Datalink, an Ethernet Industrial Bus, a Transmission Control Protocol (TCP), a User Datalink Protocol (UDP), a fiber optic, or a gigabit transceiver datalink.

29. The non-transitory computer-readable medium of claim 16, the instructions further comprising determining the respective feedforward adjustments in accordance with parameters generated by one of a plant model or an inverse plant model that describes a variation of the pulse signal as it propagates from a RF generator to the load.

* * * * *